(12) United States Patent
Shiino et al.

(10) Patent No.: US 8,953,371 B2
(45) Date of Patent: Feb. 10, 2015

(54) SEMICONDUCTOR STORAGE DEVICE

(75) Inventors: Yasuhiro Shiino, Yokohama (JP);
Shigefumi Irieda, Yokohama (JP);
Kenri Nakai, Fujisawa (JP); **Eietsu
Takahashi, Yokohama (JP); Koki Ueno**,
Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 394 days.

(21) Appl. No.: 13/425,121

(22) Filed: Mar. 20, 2012

(65) Prior Publication Data
US 2013/0058171 A1    Mar. 7, 2013

(30) Foreign Application Priority Data
Sep. 5, 2011    (JP) ................ 2011-192700

(51) Int. Cl.
*G11C 11/34* (2006.01)
*G11C 11/56* (2006.01)
*G11C 16/06* (2006.01)
*G11C 16/04* (2006.01)
*G11C 16/34* (2006.01)

(52) U.S. Cl.
CPC ............ *G11C 11/5628* (2013.01); *G11C 16/06*
(2013.01); *G11C 16/0483* (2013.01); ***G11C
16/3418*** (2013.01)
USPC ............ 365/185.03; 365/185.17; 365/185.26; 365/185.27

(58) Field of Classification Search
USPC .............. 365/185.03, 185.17, 185.26, 185.27
See application file for complete search history.

(56) References Cited

U.S. PATENT DOCUMENTS

| | | | |
|---|---|---|---|
| 5,555,204 A | 9/1996 | Endoh et al. | |
| 5,774,397 A | 6/1998 | Endoh et al. | |
| 5,946,231 A | 8/1999 | Endoh et al. | |
| 6,014,330 A | 1/2000 | Endoh et al. | |
| 6,188,611 B1 | 2/2001 | Endoh et al. | |
| 6,807,100 B2 | 10/2004 | Tanaka | |
| 6,954,378 B2 | 10/2005 | Tanaka | |
| 8,149,631 B2 | 4/2012 | Shiino et al. | |
| 2002/0048192 A1* | 4/2002 | Wang et al. | ............ 365/185.29 |
| 2003/0234408 A1 | 12/2003 | Tanaka | |
| 2003/0235080 A1 | 12/2003 | Yaegashi et al. | |
| 2005/0030828 A1 | 2/2005 | Tanaka | |

(Continued)

FOREIGN PATENT DOCUMENTS

| | | |
|---|---|---|
| JP | 7-169284 A | 7/1995 |
| JP | A-2004-023044 | 1/2004 |

(Continued)

OTHER PUBLICATIONS

Japanese Office Action issued Aug. 30, 2013, in Japan Patent Application No. 2011-192700 (with English translation).

(Continued)

*Primary Examiner* — Han Yang
(74) *Attorney, Agent, or Firm* — Oblon, Spivak, McClelland, Maier & Neustadt, L.L.P.

(57) ABSTRACT

A semiconductor storage device has a plurality of memory cells each having a control gate that are formed on a well. The semiconductor storage device has a control circuit that applies a voltage to the well and the control gates.
In an erase operation of the memory cell, the control circuit applies a first pulse wave of a first erasure voltage that rises stepwise to the well and then applies a second pulse wave of a second erasure voltage to the well.

11 Claims, 36 Drawing Sheets

(56) References Cited

U.S. PATENT DOCUMENTS

| | | |
|---|---|---|
| 2007/0036001 A1* | 2/2007 | Kanda et al. ............. 365/185.18 |
| 2011/0007572 A1 | 1/2011 | Ueno et al. |
| 2011/0013461 A1* | 1/2011 | Shiino et al. ............ 365/185.22 |
| 2011/0063917 A1 | 3/2011 | Shiino et al. |
| 2011/0228608 A1 | 9/2011 | Shiino et al. |
| 2011/0249506 A1 | 10/2011 | Umezawa et al. |
| 2012/0206972 A1* | 8/2012 | Shiino et al. ............ 365/185.19 |

FOREIGN PATENT DOCUMENTS

| | | |
|---|---|---|
| JP | 2005-276428 A | 10/2005 |
| JP | B-3730272 | 10/2005 |
| JP | 4050555 | 12/2007 |
| JP | 2011-18397 | 1/2011 |

OTHER PUBLICATIONS

U.S. Appl. No. 13/226,826, filed Sep. 7, 2011, Shiino et al.
U.S. Appl. No. 13/227,050, filed Apr. 3, 2012, Shiino et al.
Office Action issued Mar. 26, 2013, in Japanese Patent Application No. 2011-192700 with English translation.

* cited by examiner

SEMICONDUCTOR STORAGE DEVICE

CROSS-REFERENCE TO RELATED APPLICATION

This application is based upon and claims the benefit of priority from the prior Japanese Patent Application No. 2011-192700, filed on Sep. 5, 2011, the entire contents of which are incorporated herein by reference.

BACKGROUND

1. Field

Embodiments described herein relate generally to a semiconductor storage device such as NAND-type flash memory.

2. Background Art

Recent semiconductor memories tend to have smaller sizes and higher capacities. In particular, NAND-type flash memories are incorporated in many devices such as SD cards and solid state drives (SSDs). In such a circumstance, reliability degradation due to shrink are becoming manifest. A possible major cause of the degradation in the course of repeated writings and erasures is an electrical field stress imposed on tunnel oxide films of memory cells.

With the NAND-type flash memory, a Fowler-Nordheim (FN) tunnel electrical field is applied between the substrate and a charge accumulation layer of a memory cell to program or to erase charges into the charge storage layer. The memory cell stores data by associating the states of charging of the charge storage layer (a threshold voltage) with data "0" and "1", for example.

In the course of the repeated writing and erase operations, the electrical field gradually damages the tunnel oxide film of the memory cell to increase defects therein. Thus, the charges leak from the charge storage layer through the defects in the tunnel oxide film, and the data retention capability degrades.

DETAILED DESCRIPTION

A semiconductor storage device according to an embodiment comprises a plurality of memory cells each having a control gate that are formed on a well. The semiconductor storage device comprises a control circuit that applies a voltage to the well and the control gates.

In an erase operation of the memory cell, the control circuit applies a first pulse wave of a first erasure voltage that rises stepwise to the well and then applies a second pulse wave of a second erasure voltage to the well.

Hereafter, embodiments will be described more specifically with reference to the drawings.

First Embodiment

Figure 1:
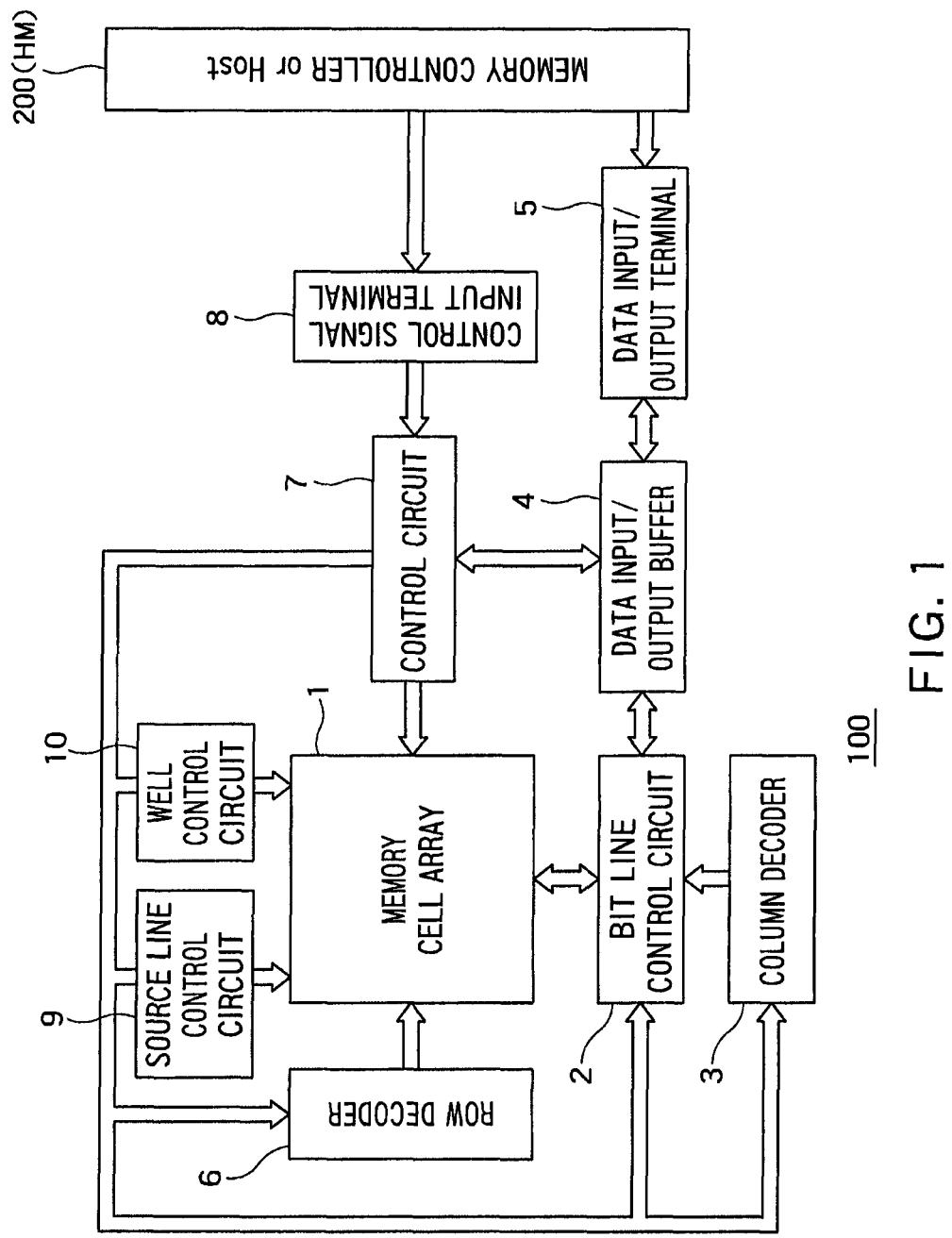
FIG. 1 is a block diagram showing an example of the configuration of a NAND-type flash memory 100 according to a first embodiment.
Figure 2:
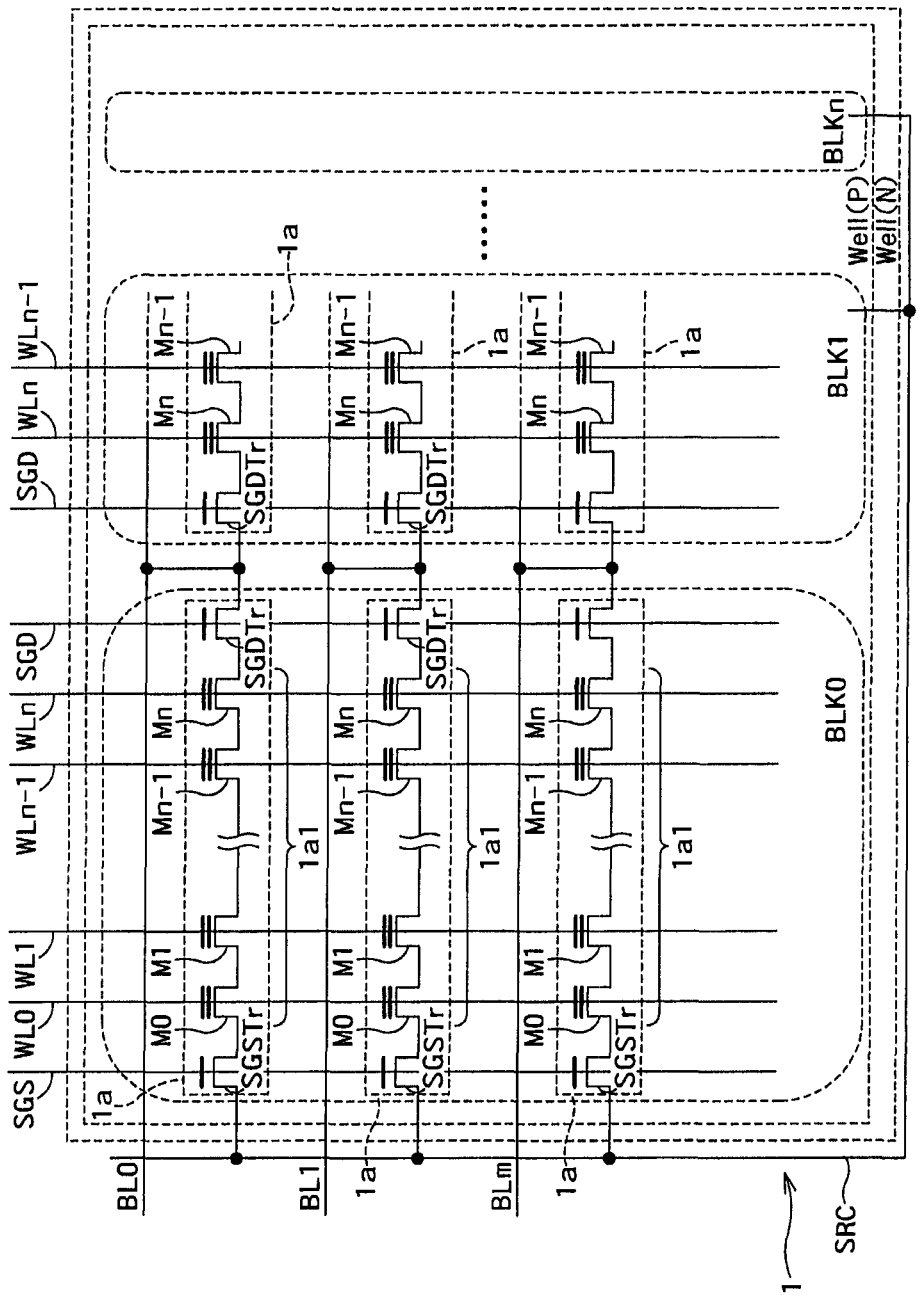
FIG. 2 is a circuit diagram showing an example of the configuration according to the first embodiment that includes a memory cell array 1, a bit line control circuit 2, and a row decoder 6 shown in FIG. 1.

FIG. 1 is a block diagram showing an example of the configuration of a NAND-type flash memory 100 according to a first embodiment. FIG. 2 is a circuit diagram showing an example of the configuration according to the first embodiment that includes a memory cell array 1, a bit line control circuit 2, and a row decoder 6 shown in FIG. 1.

As shown in FIG. 1, the NAND-type flash memory 100 includes a memory cell array 1, a bit line control circuit 2, a column decoder 3, a data input/output buffer 4, a data input/output terminal 5, a row decoder 6, a control circuit 7, a control signal input terminal 8, a source line control circuit 9, and a well control circuit 10.

The memory cell array 1 includes a plurality of bit lines, a plurality of word lines, and a source line. This memory cell array 1 includes a plurality of blocks (BLK0 to BLKn in FIG. 2) in which memory cells, into which data is electrically rewritable, formed from EEPROM cells are disposed in a matrix pattern.

The bit line control circuit 2 used for controlling the voltages of bit lines and the row decoder 6 used for controlling the voltages of the word lines are connected to this memory cell array 1. In a write operation of data, one block is selected by the row decoder 6, and the other blocks are in a non-selection state.

This bit line control circuit 2 reads data of a memory cell of the memory cell array 1 through the bit line, detects the status of the memory cell through the bit line, or writes data into the memory cell by applying a write control voltage to the memory cell through the bit line.

In addition, the bit line control circuit 2, the column decoder 3 and the data input/output buffer 4 are connected. The data storage circuit disposed inside the bit line control circuit 2 is selected by the column decoder 3, and the data of the memory cell that is read out by the data storage circuit is output to the outside thereof from the data input/output terminal 5 through the data input/output buffer 4.

In addition, write data input from the outside to the data input/output terminal 5 is stored in the data storage circuit that is selected by the column decoder 3 through the data input/output buffer 4. From the data input/output terminal 5, various commands such as a write, a read, an erase, and a status read and an address other than the write data are also input.

The row decoder 6 is connected to the memory cell array 1. This row decoder 6 applies a voltage for read, write, or erase to a word line of the memory cell array 1.

The source line control circuit 9 is connected to the memory cell array 1. This source line control circuit 9 is configured so as to control the voltage of the source line SRC.

The well control circuit 10 is connected to the memory cell array 1. This well control circuit 10 is configured so as to control the voltage of a semiconductor substrate (well) in which the memory cells are formed.

The control circuit 7 is configured so as to control the memory cell array 1, the bit line control circuit 2, the column decoder 3, the data input/output buffer 4, the row decoder 6, the source line control circuit 9, and the well control circuit 10. That is, the control circuit 7 has a function of generally controlling the overall operation of the NAND-type flash memory 100.

Here, a voltage booster circuit (not shown) that raises the voltage of a power source voltage is assumed to be included in the control circuit 7. The control circuit 7 is configured so as to raise the voltage of the power source voltage as necessary by using the voltage booster circuit and supply a resultant voltage to the bit line control circuit 2, the column decoder 3, the data input/output buffer 4, the row decoder 6, the source line control circuit 9, and the well control circuit 10.

This control circuit 7 controls operation according to control signals (a command latch enable signal CLE, an address latch enable signal ALE, a ready/busy signal RY/BY, or the like) that are input from the outside through the control signal input terminal 8 and a command that is input from the data input/output terminal 5 through the data input/output buffer 4. In other words, when data is programmed, verified, read, and erased according to the control signals and the command, the control circuit 7 generates a desired voltage and supplies the resultant voltage to each portion of the memory cell array 1. Alternatively, the control circuit 7 may be located on another of the chips that incorporates the memory cell array 1.

The control circuit 7 executes a control operation in response to a control signal (a command latch enable signal CLE, an address latch enable signal ALE, a ready/busy signal RY/BY or the like) input at the control signal input terminal 8 from a memory controller or host HM and a command input at the data input/output terminal 5 and passed thereto via the data input/output buffer 4. The memory controller or host HM may be a semiconductor device 200 on another of the NAND-type flash memory 100. In response to the control signal and the command, the control circuit 7 generates a voltage to perform programming (writing), verification, readout or erase of data and supplies the voltage to each part of the memory cell array 1.

Here, as shown in FIG. 2, the memory cell array 1 has blocks BLK0 to BLKn each configured by connecting a plurality of NAND cell units 1a. The blocks BLK0 to BLKn are formed in a p well Well(p) that is formed in an n well Well(n) of the semiconductor substrate.

The NAND cell unit 1a is configured by a plurality of memory cells M0 to Mn (for example, n=63), which are connected in series, configuring a NAND string, a drain-side selection MOS transistor SGDTr, and a source-side selection MOS transistor SGSTr. In addition, the drain-side selection MOS transistor SGDTr is connected to the bit line and the source-side selection MOS transistor SGSTr is connected to the source line SRC. Here, the source-side selection gate transistor SGSTr and the drain-side selection gate transistor SGDTr are n-type MOS transistors.

A control gate of the memory cells M0 to Mn disposed in each row is connected to the word lines WL0 to WLn.

The bit lines BL0 to BLm are disposed so as to run perpendicular to the word lines WL0 to WLn and the source line SRC.

In addition, the gate of the drain-side selection MOS transistor SGDTr is connected to a drain-side selection gate line SGD. The drain-side selection gate transistor SGDTr is connected between one end of the NAND string 1a1 and the respective bit lines BL0 to BLm.

In addition, the gate of the source-side selection MOS transistor SGSTr is connected to a source-side selection gate line SGS. The source-side selection gate transistor SGSTr is connected between the other end of the NAND string 1a1 and the source line SRC.

The row decoder 6 is connected to the word lines WL0 to WLn, the drain-side selection gate line SGD and the source-side selection gate line SGS via a transfer gate (not shown). When the transfer gate is turned on, a voltage (e, q, writing voltage) can be applied to at least one of the word lines WL0 to WLn, the drain-side selection gate line SGD and the source-side selection gate line SGS. The word lines WL0 to WLn, the drain-side selection gate line SGD and the source-side selection gate line SGS can be set into a floating state by turning off the transfer gate.

The row decoder 6 selects from among the blocks BLK0 to BLKn of the memory cell array 1 and controls the writing and readout operations of the selected block. In other words, the row decoder 6 controls the voltage applied to the drain-side selection gate line and the source-side selection gate line and the voltage applied to the word lines (control gates of the memory cells), thereby selecting from among the memory cells.

Consider a case where the block BLK0 is erased, and the block BLK1 is not erased.

The transfer gate of the row decoder 6 connected to the block BLK0 is turned on in order to apply 0V to the word lines WL0 to WLn, the drain-side selection gate line SGD and the source-side selection gate line SGS of the block BLK0 to be erased.

On the other hand, the transfer gate of the row decoder 6 connected to the block BLK1 is turned off in order to bring the word lines WL0 to WLn of the block BLK1 not to be erased into the floating state.

To achieve erase, a common erase voltage is applied to wells "Well(p)" and "Well(n)". Thus, the potential at the word lines of the block BLK1 not to be erased rises because of capacitive coupling. As a result, a high potential difference occurs between the source and the drain of the transfer gate of the block BLK1 not to be erased. If the erase condition keeps long, the transfer gate of the block BLK1 not to be erased degrades.

Figure 3:
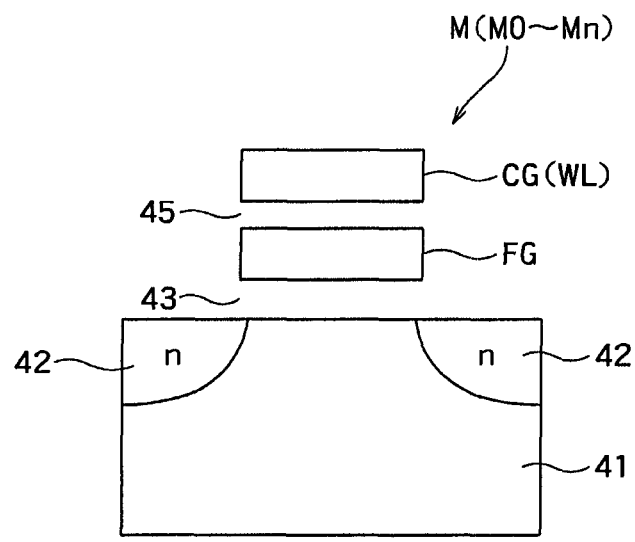
FIG. 3 is a cross-sectional view of a memory cell in the memory cell array 1 shown in FIG. 2.

FIG. 3 is a cross-sectional view of a memory cell in the memory cell array 1 shown in FIG. 2.

As shown in FIG. 3, the memory cell M (M0 to Mn) has a charge storage layer (shown as a charge accumulation layer FG in the description of this embodiment for example), a control gate CG (WL), and diffusion layers 42. The control gate CG is electrically connected to the word line WL of the memory cell M and shared among the plurality of memory cells M0 to Mn. The charge accumulation layer is not limited to the floating gate but may be an insulating film based on trap level.

The diffusion layers 42, which form source and drain diffusion layers (n+ diffusion layers in this embodiment) of the memory cell M, are formed in the well "Well(p)" (shown as a well 41 in FIG. 3) formed in the semiconductor substrate. The charge accumulation layer FG is formed on the well 41 with a gate insulating film (tunnel insulating film) 43 interposed therebetween. The control gate CG is formed on the charge accumulation layer FG with a gate insulating film 45 interposed therebetween.

The memory cell M stores data according to the threshold voltage thereof, and the data stored in the memory cell M can be electrically rewritten by controlling the threshold voltage. The threshold voltage is determined by the amount of charges stored in the floating gate FG. The amount of charges in the floating gate FG can be varied by varying the tunnel current passing through the gate insulating film 43.

Specifically, if the voltage on the control gate CG is raised to be sufficiently higher than those on the well 41 and on the diffusion layers (the source diffusion layer and the drain diffusion layer) 42, charges are programmed into the floating gate FG through the gate insulating film 43. In this way, the threshold voltage of the memory cell M rises (this state corresponds to the written state in the case of storing binary data, for example).

On the other hand, if the voltage on the well 41 and on the diffusion layers (the source diffusion layer and the drain diffusion layer) 42 is raised to be sufficiently higher than that on the control gate CG, the charges are discharged from the charge accumulation layer FG through the gate insulating film 43. In this way, the threshold voltage of the memory cell M lowers (this state corresponds to the erased state in the case of storing binary data, for example).

In this way, the data stored in the memory cell M can be rewritten by controlling the amount of charges stored in the floating gate FG.

Figure 4:
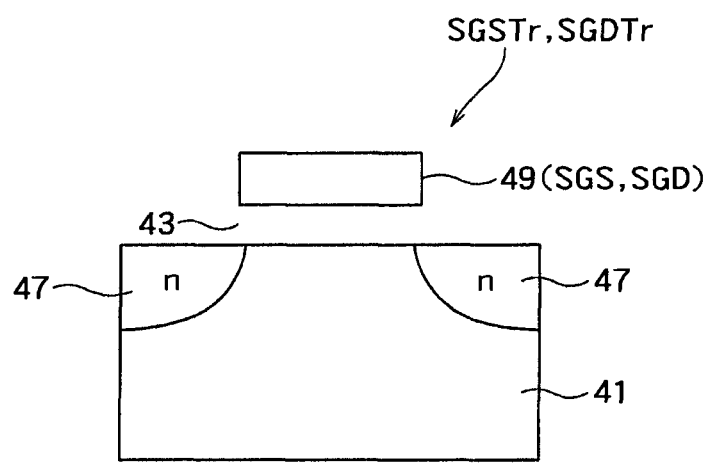
FIG. 4 is a cross-sectional view of the drain-side selection MOS transistor SGDTr or the source-side selection MOS transistor SGSTr of the memory cell array 1 shown in FIG. 2.

FIG. 4 is a cross-sectional view of the drain-side selection MOS transistor SGDTr or the source-side selection MOS transistor SGSTr of the memory cell array 1 shown in FIG. 2.

As shown in FIG. 4, diffusion layers 47, which form source and drain diffusion layers of the drain-side selection MOS transistor SGDTr or the source-side selection MOS transistor SGSTr, are formed in the well 41. A control gate 49 (SGS or SGD) is formed on the well 41 with a gate insulating film 48 interposed therebetween.

Figure 5:
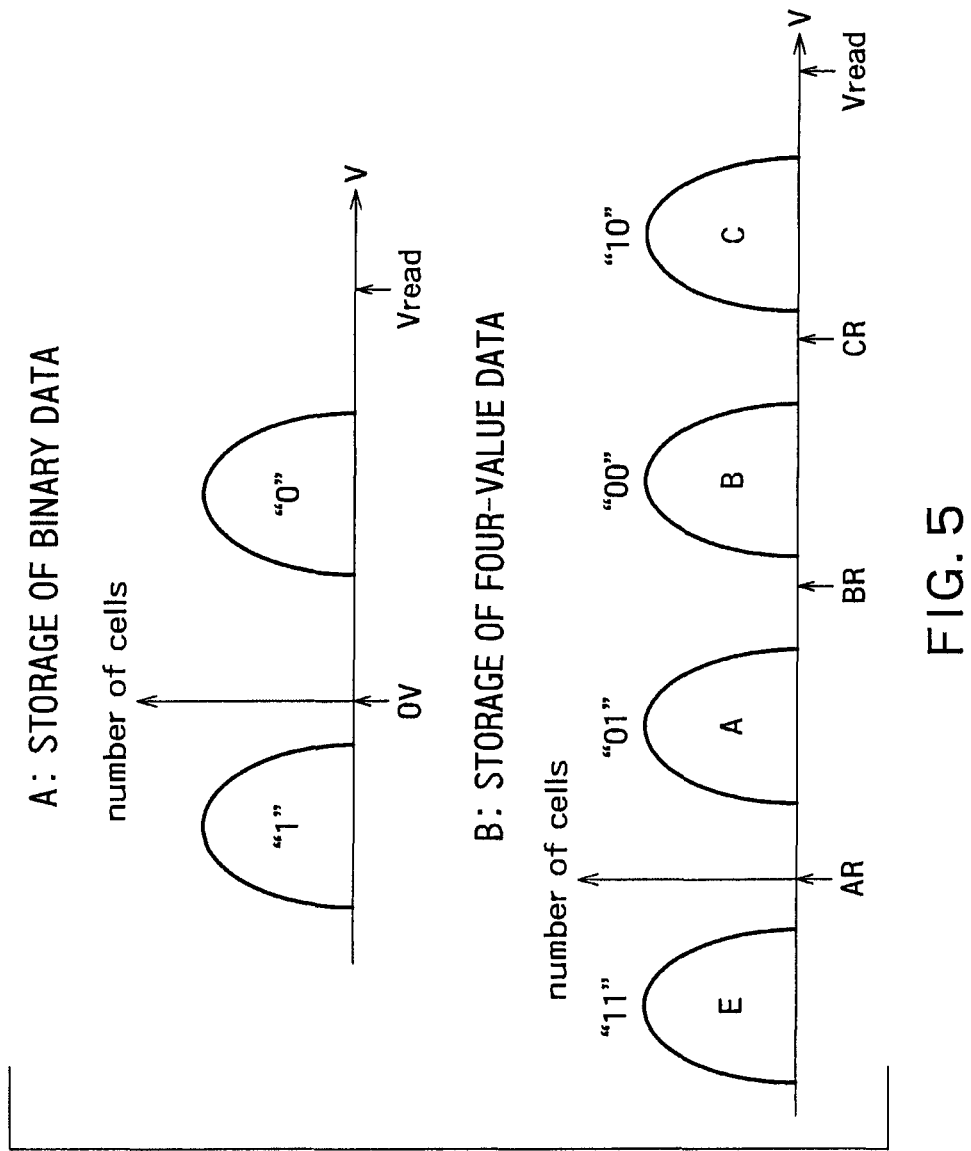
FIG. 5 shows threshold voltage distributions of the memory cell M.

FIG. 5 shows threshold voltage distributions of the memory cell M.

As shown in FIG. 5, in the case where the memory cell M stores binary data (1 bit/cell), the threshold voltage distribution for the data is as shown by "A" in FIG. 5. The negative threshold voltage distribution corresponds to the data "1" (the erase state), and the positive threshold voltage distribution corresponds to the data "0".

In the case where the memory cell M stores four-value data (2 bits/cell), the threshold voltage distribution for the data is as shown by "B" in FIG. 5. In this case, four threshold voltage distributions are provided, which are denoted by "E", "A", "B" and "C" in ascending order of the threshold voltage.

The threshold voltage distributions are allocated four data "11", "01", "00" and "10". The threshold voltage distribution "E" is a state in which the threshold voltage is negative, which occurs as a result of collective block erase in an erase sequence described later.

Voltages "AR", "BR" and "CR" between the threshold voltage distributions are criterion voltages used in readout.

A voltage "Vread" (referred to also as a readout pass voltage) is higher than the upper limit of the highest threshold voltage distribution C. The voltage "Vread" is a voltage applied to a word line that is not selected in readout.

Figure 6:
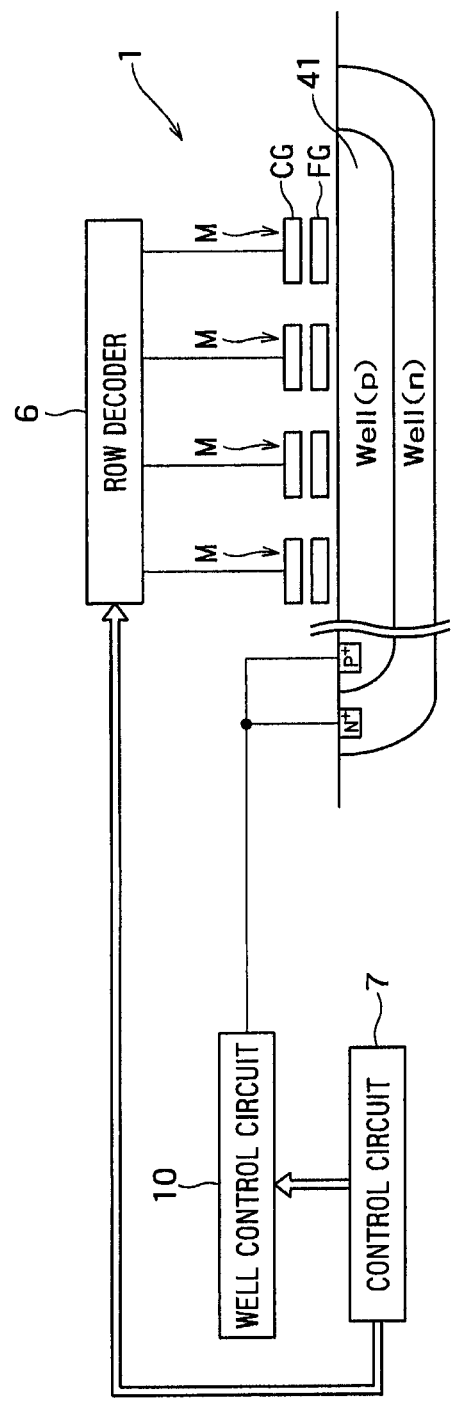
FIG. 6 is a diagram showing a cross-sectional configuration of a part of the memory cell array 1.

FIG. 6 is a diagram showing a cross-sectional configuration of a part of the memory cell array 1.

As shown in FIG. 6, in the erase operation, the well control circuit 10 outputs an output voltage (erase voltage) "VERA" under the control of the control circuit 7. The output voltage (erase voltage) "VERA" is appropriately controlled by the well control circuit 10 and applied to the wells "Well(p)" and "Well(n)".

In the erase operation of the memory cell M, the potential at the control gate CG of the memory cell M formed on the charge accumulation layer FG with the insulating film interposed therebetween is set at a fixed potential (ground potential) by the row decoder 6, for example.

Thus, when the erase voltage "VERA" that rises stepwise is applied in pulses voltage to the wells "Well(p)" and "Well(n)", the potential at the wells "Well(p)" and "Well(n)" rises to be higher than that at the charge accumulation layer FG. As a result, the charges stored in the charge accumulation layer FG flow into the wells "Well(p)" and "Well(n)" through the tunnel insulating film (in other words, the data stored in the memory cell M is erased).

On the other hand, in the writing operation, the row decoder 6 applies a writing voltage to the control gate CG under the control of the control circuit 7. The writing voltage is appropriately controlled by the row decoder and applied to the control gate CG.

In the writing operation of the memory cell M, the well control circuit 10 sets the potential at the wells "Well(p)" and "Well(n)" at a fixed potential (ground potential) under the control of the control circuit 7.

Thus, when the writing voltage that rises stepwise is applied in pulses voltage to the control gate CG, the potential at the charge accumulation layer FG rises to be higher than that at the wells "Well(p)" and "Well(n)". As a result, charges inject from the wells "Well(p)" and "Well(n)" into the charge accumulation layer FG through the tunnel insulating film and are stored in the charge accumulation layer FG (in other words, data is stored in the memory cell M).

Next, an example of the erase operation of the semiconductor storage device 100 configured as described above will be described. In the following, a waveform of the erase voltage output from the well control circuit in the erase operation will be described. A waveform of the writing voltage output from the row decoder 6 in the writing operation will also be described. In this case, an erase verification performed to verify whether erase of the memory cell M is completed or not corresponds to a writing verification performed to verify whether writing of the memory cell M is completed or not. And application of a pulse wave of the erase voltage (which may rise stepwise) to the wells "Well(p)" and "Well(n)" by the well control circuit 10 corresponds to application of a pulse wave of the writing voltage (which may rise stepwise) to the control gate CG by the row decoder 6.

(First Embodiment)

Figure 7:
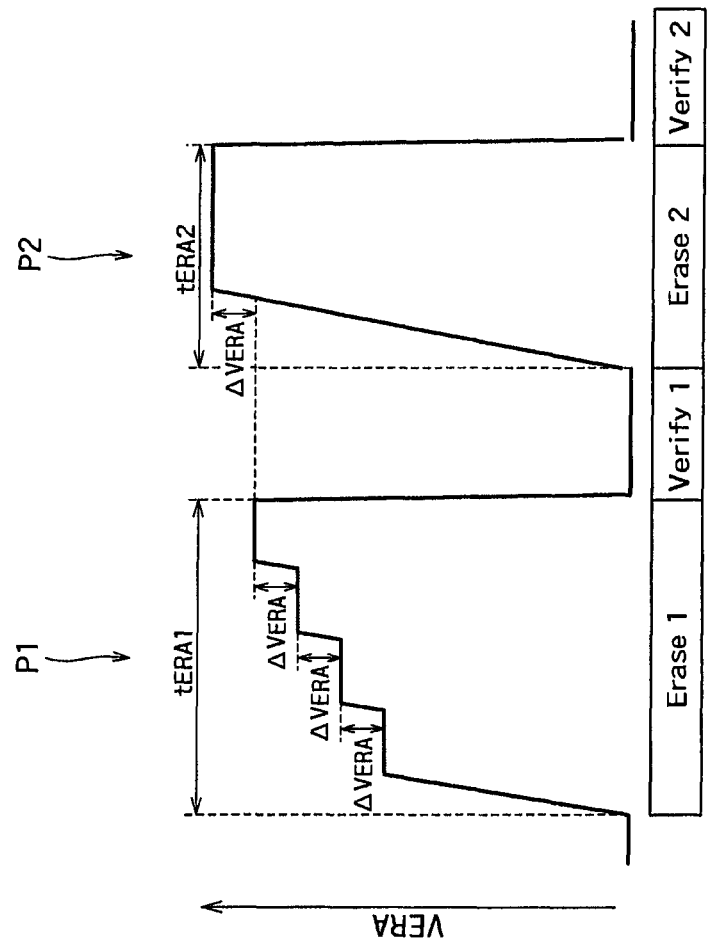
FIG. 7 is a waveform diagram showing an example of a waveform of the erasure voltage output from the well control circuit in the erase operation of the memory cell.

FIG. 7 is a waveform diagram showing an example of a waveform of the erase voltage output from the well control circuit in the erase operation of the memory cell. In FIG. 7, the vertical axis indicates the erase voltage "VERA", and the horizontal axis indicates the time.

In the erase operation of the memory cell M, the row decoder 6 sets the potential at the control gate CG of the memory cell M at a fixed potential (ground potential, for example).

The well control circuit 10 applies a first pulse wave P1 whose amplitude is a first erase voltage that rises stepwise to the wells "Well(p)" and "Well(n)" ("Erase1").

Then, an erase verification is performed to verify whether erase of the memory cell M is completed or not ("Verify1"). That is, the erase verification occurs between application of the first pulse wave P1 to the wells "Well(n)" and "Well(p)" and application of a second pulse wave P2 to the wells "Well(n)" and "Well(p)".

If the memory cell M is not completed erase operation according to the erasure verification ("Verify1"), the well control circuit 10 applies a second pulse wave P2 whose amplitude is a second erase voltage to the wells "Well(n)" and "Well(p)" ("Erase2").

Then, the erase verification is performed ("Verify2").

A first pulse width tERA1 of the first pulse wave P1 is larger than a second pulse width tERA2 of the second pulse wave P2, which is substantially a square wave. The second erase voltage is set to be higher than the first erase voltage by ΔVERA. The difference between the steps of the first pulse wave is also ΔVERA.

The pulse width means the duration of the pulse wave between rising (rising of the first step of the pulse wave in the case where the pulse wave rises stepwise) and falling after leveling off. The pulse wave can be observed by probing the wire through which the voltage is supplied to the wells "Well(n)" and "Well(p)". Alternatively, the pulse wave can be observed by probing an output of a voltage generating circuit.

Since the pulse width tERA1 of the stepwise first pulse wave P1, which is applied first, is larger than the second pulse width tERA2 of the second pulse wave P2 as described above, more charges leak from the charge accumulation layer FG into the well "Well(p)" when the first pulse wave P1 is applied. Thus, the second pulse width tERA2 of the second pulse wave P2, which is applied second, can be reduced, thereby reducing the stress imposed by the second pulse wave P2 on the tunnel insulating film.

Figure 8:
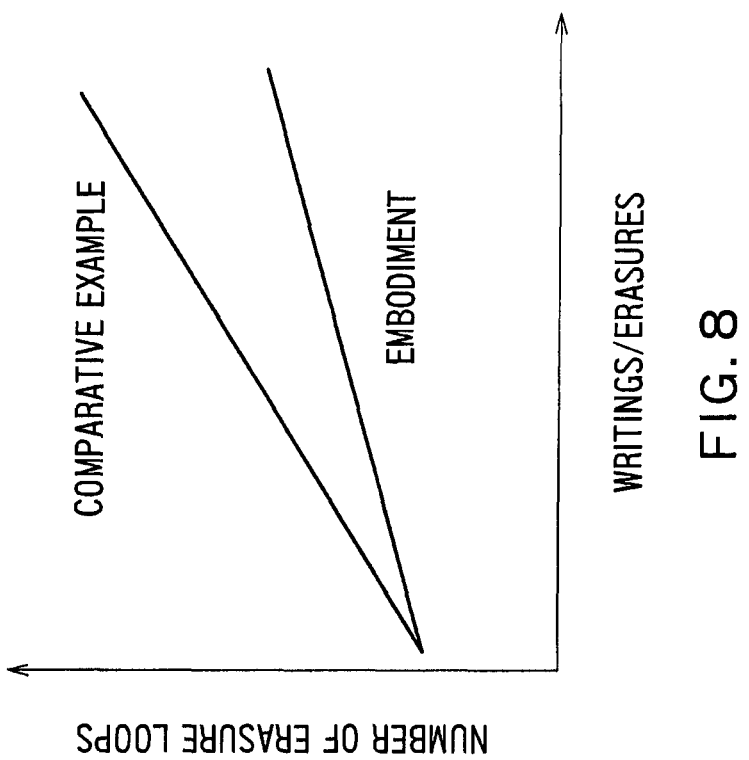
FIG. 8 is a diagram showing the relationship between the number of erasure loops and the number of writings/erasures.

As shown in FIG. 8, the reduction of the stress on the tunnel insulating film can lead to a reduction of the number of erase loops. In the comparative example, the erase operation is performed using only substantially square waves. As can be seen, according to this embodiment, even when the number of writings/erases increases, the number of erase loops is less likely to increase because the tunnel insulating film is less susceptible to degradation. As a result, even when the number of writings/erases increases, erase failure (a failure that the memory cell M cannot be erased despite a specification number of applications of the erasure voltage) is less likely to occur, and the erase operation can be achieved in a shorter time. Next, FIG. 9 is a waveform diagram showing another example of the waveform of the erasure voltage output from the well control circuit in the erase operation of the memory cell.

(Modification 1)

Figure 9:
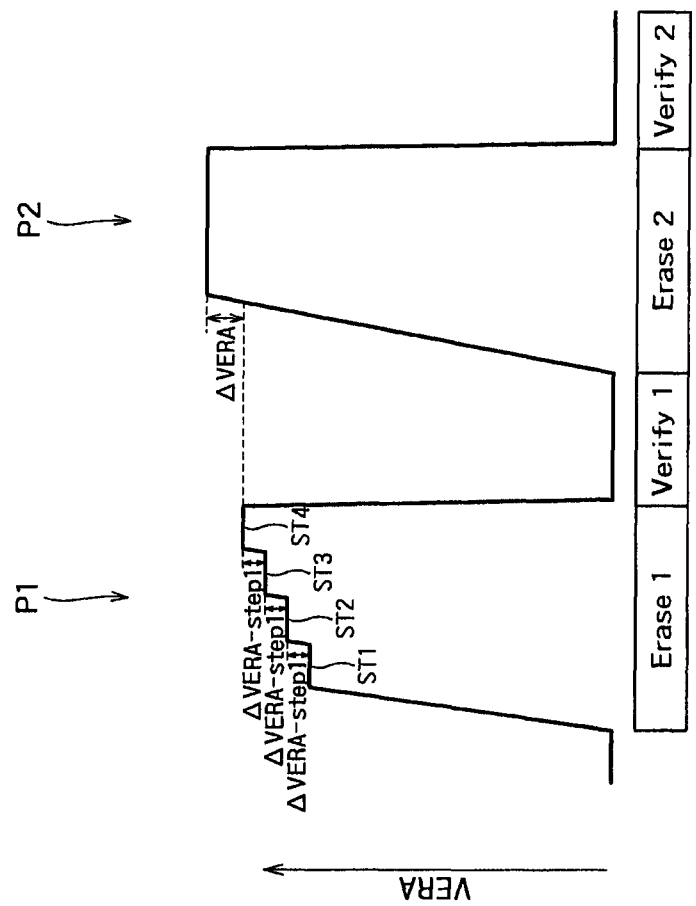
FIG. 9 is a waveform diagram showing the other example of a waveform of the erasure voltage output from the well control circuit in the erase operation of the memory cell.

As shown in FIG. 9, the step difference (ΔVERA−step1) of the first erase voltage that rises stepwise is set to be smaller than the difference (ΔVERA) between the second erase voltage of the second pulse wave P2 and the final value of the first erase voltage that rises stepwise. The first pulse wave P1 rises in four steps: a first step ST1, a second step ST, a third step ST3 and a fourth step ST4.

Since the step difference (ΔVERA−step1) of the first pulse wave P1 is smaller than the difference (ΔVERA), the first pulse wave P1 causes gentle discharge of the charge accumulation layer FG into the well "Well(p)", so that the stress on the tunnel insulating film can be reduced. More specifically, when the first step ST1 of the first pulse wave P1 is applied, a large amount of charges is stored in the charge accumulation layer FG. If a high voltage is applied to the well "Well(p)" at this point, a high electrical field stress is imposed on the tunnel insulating film. In view of this, in order to reduce the electrical field stress on the tunnel insulating film, the first pulse wave P1 is adapted to rise from the first step ST1 to the fourth step ST4 in small rises stepwise "step1".

After the charges in the charge accumulation layer is reduced to some extent by application of the first pulse wave P1, the erase voltage in the form of the second pulse wave P2 that is raised from the fourth step ST4 of the first pulse wave P1 by ΔVERA is applied. As a result, the erase operation can be achieved in a shorter time while reducing the electrical field stress on the tunnel insulating film.

In addition, since the electrical field stress imposed on the tunnel insulating film by the application of the first pulse wave P1 is reduced, the pulse width tERA1 of the first pulse wave P1 may be substantially equal to the pulse width tERA2 of the second pulse wave P2. As a result, the erase operation can be achieved in a shorter time.

(Modification 2)

Figure 10:
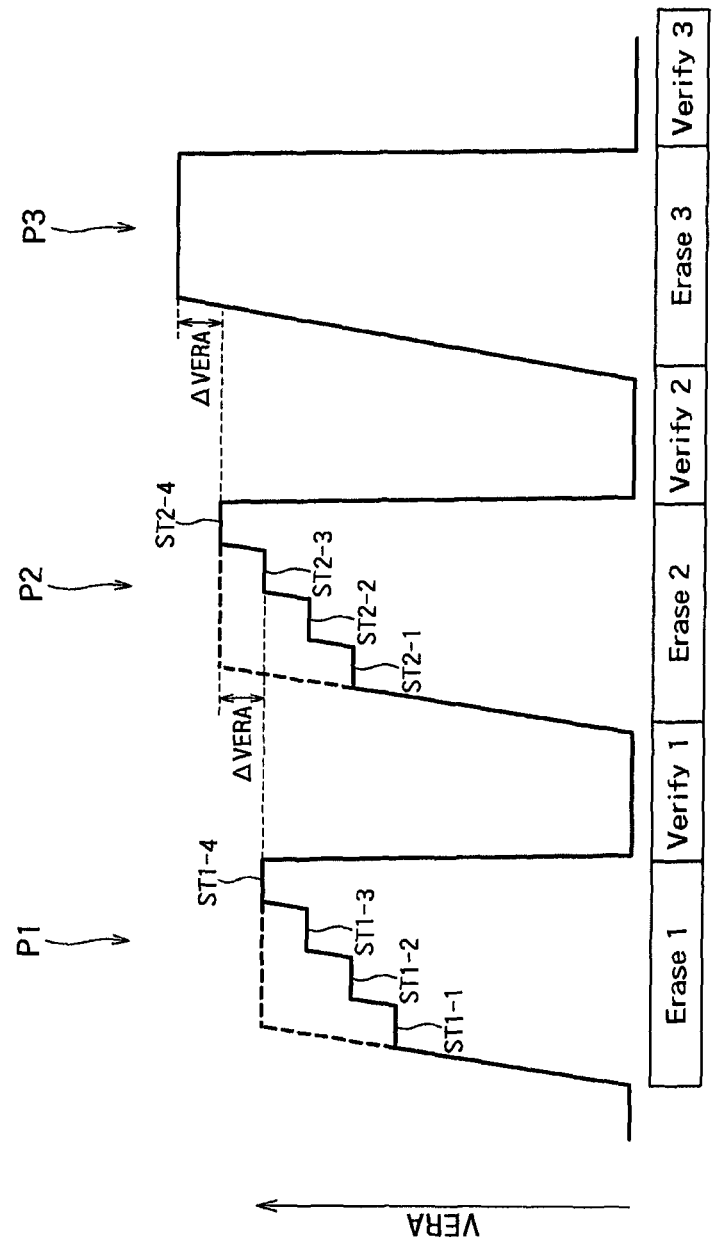
FIG. 10 is a waveform diagram showing still another example of a waveform of the erasure voltage output from the well control circuit in the erase operation of the memory cell.

Next, FIG. 10 is a waveform diagram showing another example of the waveform of the erase voltage output from the well control circuit in the erase operation of the memory cell.

As shown in FIG. 10, the second erase voltage of the second pulse wave P2 is also adapted to rise stepwise. As with the first pulse wave P1, the second pulse wave P2 rises in four steps (a first step ST2-1 to a fourth step ST2-4).

The initial value of the second erase voltage of the second pulse wave P2 that rises stepwise is set to be lower than the final value of the first erase voltage of the first pulse wave P1 that rises stepwise. That is, the voltage of a fourth step ST1-4 of the first pulse wave P1 is higher than that of the first step St2-1 of the second pulse wave P2.

The final value of the second erase voltage of the second pulse wave P2 that rises stepwise (the value of the fourth step ST2-4) is set to be higher than the final value of the first erase voltage of the first pulse wave P1 that rises stepwise (the value of the fourth step ST1-4).

In the example shown in FIG. 10, if it is verified in the erase verification ("Verify2") that erase of the memory cell M is not completed, the well control circuit 10 applies a third pulse wave P3 whose amplitude is a third erase voltage to the wells "Well(p)" and "Well(n)" ("Erase3").

The third erase voltage of the third pulse wave P3 is set to be higher than the fourth step ST2-4 of the second erase voltage of the second pulse wave P2.

After the third pulse wave P3 is applied to the wells "Well (p)" and "Well(n)", an erase verification is performed ("Verify3").

Since the second erase voltage of the second pulse wave P2 is adapted to rise stepwise, the stress imposed on the tunnel insulating film by the second pulse wave P2, which is applied second, can be reduced. For example, consider a case where the writing and erase operations are repeated to cause degradation of the tunnel insulating film (or to increase the number of defects), and the memory cell becomes hard to discharge. In this case, the first pulse wave P1 may not suffice for adequate discharge of the charge accumulation layer. Thus, the second pulse wave P2, which is applied second, is also adapted to rise stepwise to reduce the electrical field on the tunnel insulating film. The degree of degradation of the tunnel insulating film can be estimated by recording the number of writings/erases operations or based on the number of pulses applied in the previous erase operation.

In addition, since the first step ST2-1 of the second pulse wave P2 is lower than the fourth step ST1-4 of the first pulse wave P1, abrupt application of the electrical field on the tunnel insulating film is prevented. In addition, since the fourth step ST2-4 of the second pulse wave P2 is higher than the fourth step ST1-4 of the first pulse wave P1, the charges stored in the charge accumulation layer can be sufficiently erased.

(Modification 3)

Figure 11:
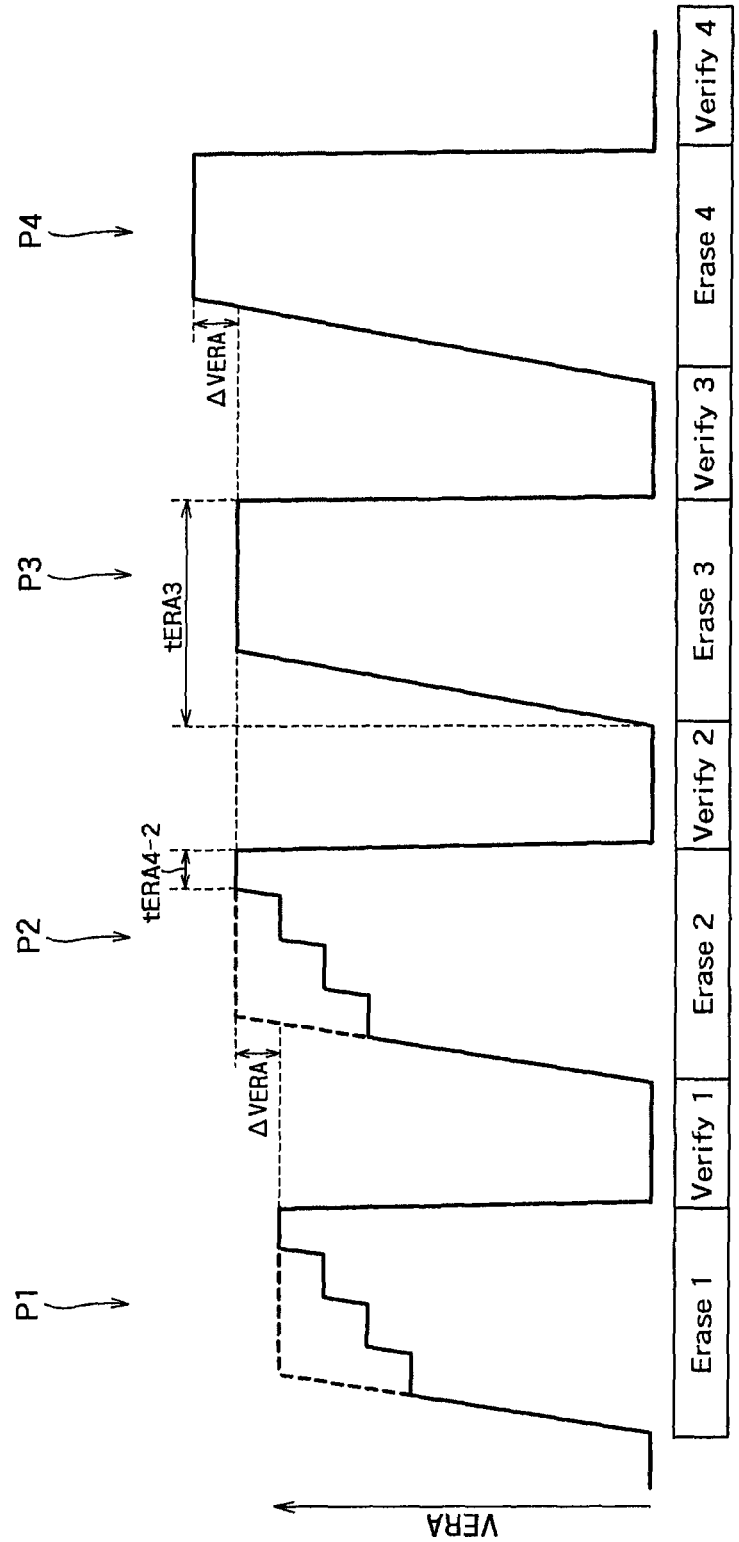
FIG. 11 is a waveform diagram showing still another example of a waveform of the erasure voltage output from the well control circuit in the erase operation of the memory cell.

Next, FIG. 11 is a waveform diagram showing another example of the waveform of the erase voltage output from the well control circuit in the erase operation of the memory cell.

As shown in FIG. 11, a third erase voltage of a third pulse wave P3 is set to be equal to the final value of the second erase voltage that rises stepwise (the value of the fourth step ST2-4).

In the example shown in FIG. 11, the memory cell M is not completed erase operation according to the erasure verification ("Verify3"), the well control circuit 10 applies a fourth pulse wave P4 whose amplitude is a fourth erase voltage to the wells "Well(p)" and "Well(n)" ("Erase4").

The fourth erase voltage of the fourth pulse wave P4 is set to be higher than the third erase voltage of the third pulse wave P3.

After the fourth pulse wave P4 is applied to the wells "Well(p)" and "Well(n)", an erase verification is performed ("Verify4").

Since the third erase voltage of the third pulse wave P3 is adapted to be equal to the final value of the second erase voltage that rises stepwise, the stress imposed on the tunnel insulating film can be reduced, and the erase operation can be achieved in a shorter time. A width tETA3 of the third pulse wave P3 is larger than a width tST4-2 of the fourth step ST2-4 of the second pulse wave P2. Therefore, the charges in the charge accumulation layer may be sufficiently erased without setting the third erase voltage higher than the fourth step ST2-4 of the second pulse wave P2. Since the third pulse wave P3 does not have to be raised, the stress on the tunnel insulating film can be reduced, and the rising time of the third pulse wave P3 can be reduced, thereby reducing the duration of the erase operation.

(Modification 4)

Figure 12:
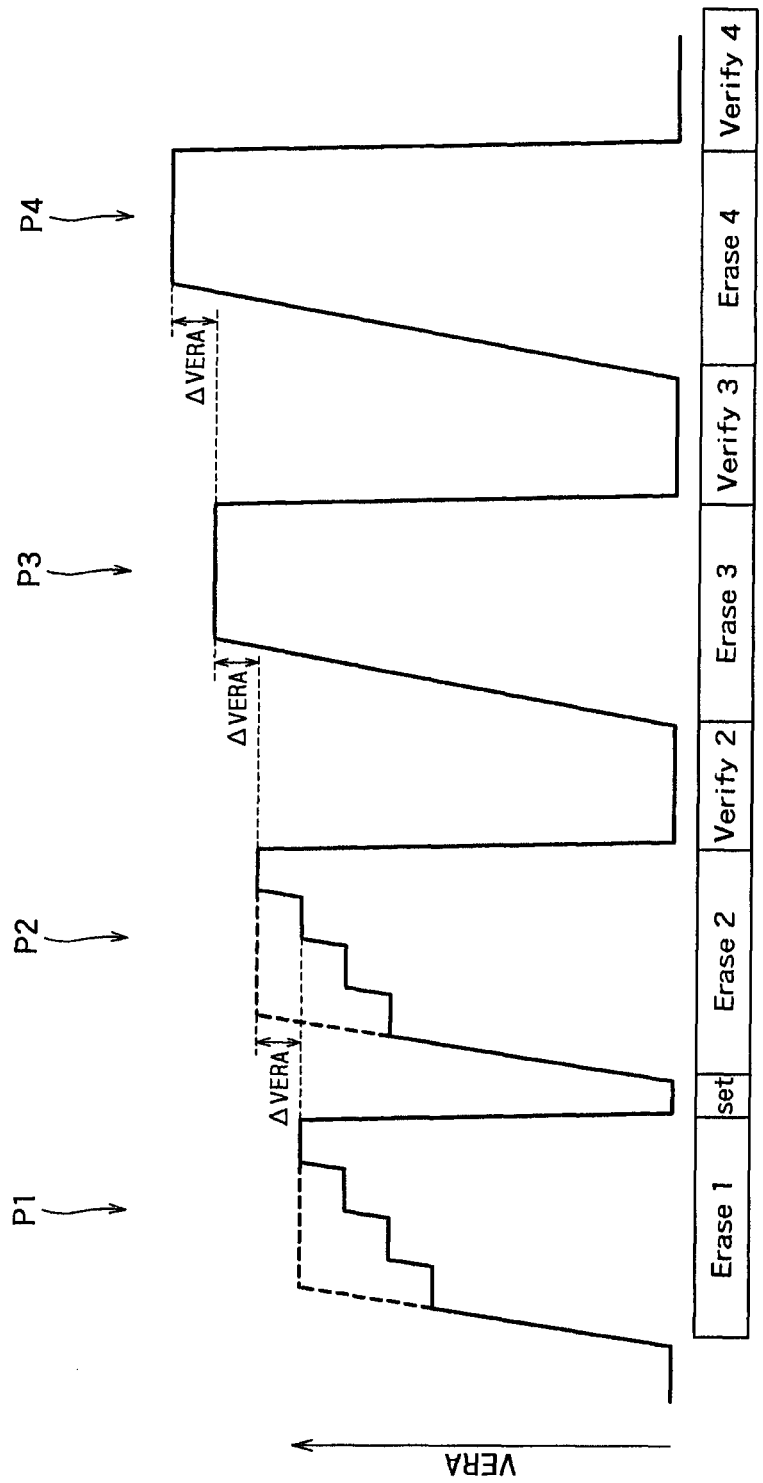
FIG. 12 is a waveform diagram showing still another example of a waveform of the erasure voltage output from the well control circuit in the erase operation of the memory cell.

Next, FIG. 12 is a waveform diagram showing another example of the waveform of the erase voltage output from the well control circuit in the erase operation of the memory cell.

As shown in FIG. 12, after the first pulse wave P1 is applied to the wells "Well(p)" and "Well(n)", a set period occurs before the second pulse wave P2 is applied to the wells "Well(p)" and "Well(n)". That is, the erase verification can be omitted between the application of the first pulse wave P1 to the wells "Well(p)" and "Well(n)" and the application of the second pulse wave P2 to the wells "Well(p)" and "Well(n)".

In particular, when the tunnel insulating film has degraded because of repeated writings/erases operations, there is a small possibility of passing the first erase verification ("Verify1"). Thus, the first erase verification ("Verify1") can be omitted to reduce the duration of the entire erase operation. The degree of degradation of the tunnel insulating film can be estimated by recording the cumulative number of writings/ erases operations or based on the number of pulses applied in the previous erase operation.

(Modification 5)

Figure 13:
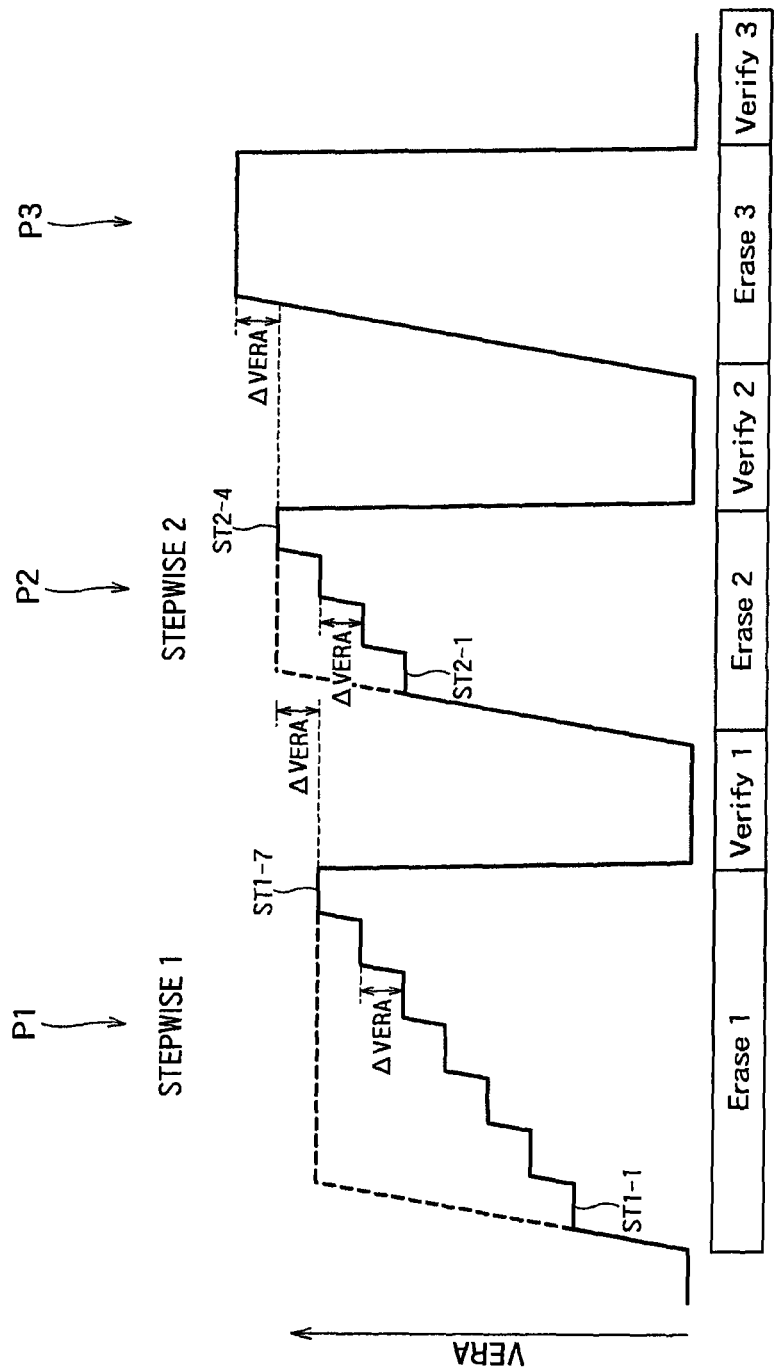
FIG. 13 is a waveform diagram showing still another example of a waveform of the erasure voltage output from the well control circuit in the erase operation of the memory cell.

Next, FIG. 13 is a waveform diagram showing another example of the waveform of the erase voltage output from the well control circuit in the erase operation of the memory cell.

As shown in FIG. 13, the number of steps of the second erase voltage of the second pulse wave P2 that rises stepwise differs from the number of steps of the first erase voltage of the first pulse wave P1 that rises stepwise.

In particular, in the example shown in FIG. 13, the number of steps of the first erase voltage of the first pulse wave P1 that rises stepwise (seven steps ST1-1 to ST1-7) is larger than the number of steps of the second erase voltage of the second pulse wave P2 that rises stepwise (four steps ST2-1 to ST2-4). The difference between the steps of the first pulse wave P1 and the second pulse wave P2 is $\Delta$VERA.

Since the number of steps of the second erase voltage of the second pulse wave P2 that rises stepwise differs from the number of steps of the first erase voltage of the first pulse wave P1 that rises stepwise, the stress on the tunnel insulating film can be reduced.

More specifically, since the number of steps of the first pulse wave P1 is larger than the number of steps of the second pulse wave P2, the width tERA1 of the first pulse wave can be longer than the width tERA2 of the second pulse wave. As a result, the stress on the tunnel insulating film can be reduced. In addition, the first step ST1-2 of the second pulse wave P2 is lower than a seventh step ST1-7 of the first pulse wave P1, so that the electrical field stress on the tunnel insulating film can be reduced even if the tunnel insulating film has degraded.

In addition, the step difference of each pulse wave is set so that the final step ST2-4 of the second pulse wave P2 is higher than the final step ST1-7 of the first pulse wave P1, so that the charges stored in the charge accumulation layer can be erased with high probability by applied the second pulse wave P2.

(Modification 6)

Figure 14:
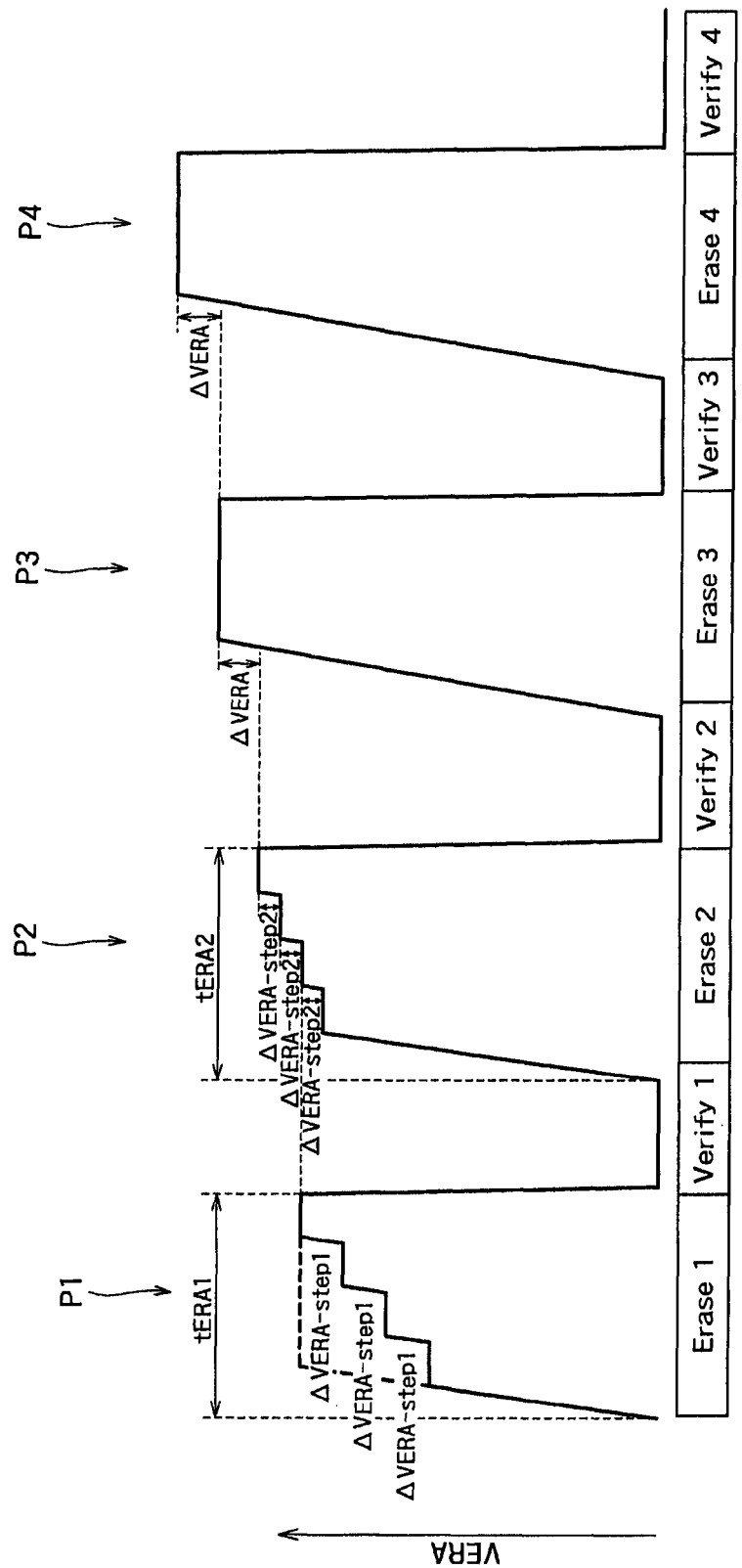
FIG. 14 is a waveform diagram showing still another example of a waveform of the erasure voltage output from the well control circuit in the erase operation of the memory cell.

Next, FIG. 14 is a waveform diagram showing another example of the waveform of the erase voltage output from the well control circuit in the erase operation of the memory cell.

As shown in FIG. 14, the step difference ($\Delta$VERA-step2) of the second erase voltage of the second pulse wave P2 that rises stepwise is set to be smaller than the step difference ($\Delta$VERA-step1) of the first erase voltage of the first pulse wave P1 that rises stepwise. That is, a relationship holds that $\Delta$VERA>$\Delta$VERA-step1>$\Delta$VERA-step2.

Since the step difference ($\Delta$VERA-step2) of the second erase voltage is set to be smaller than the step difference ($\Delta$VERA-step1) of the first erase voltage, the stress imposed on the tunnel insulating film by application of the third pulse wave P3, which is applied third, can be reduced.

In addition, the first step ST1-1 of the first pulse wave P1, which is applied when a relatively large amount of charges is stored in the charge accumulation layer, can be a lower voltage, so that the electric charge stress on the tunnel insulating film can be reduced, and the erase operation can be achieved in a shorter time.

In addition, the width tERA1 of the first pulse wave P1 can be reduced. That is, if the number of steps of the first pulse wave P1 is equal to the number of steps of the second pulse wave P2, the width tERA1 of the first pulse wave P1 can be substantially equal to the width tERA2 of the second pulse wave P2. As a result, the erase operation can be achieved in a shorter time.

(Modification 7)

Figure 15:
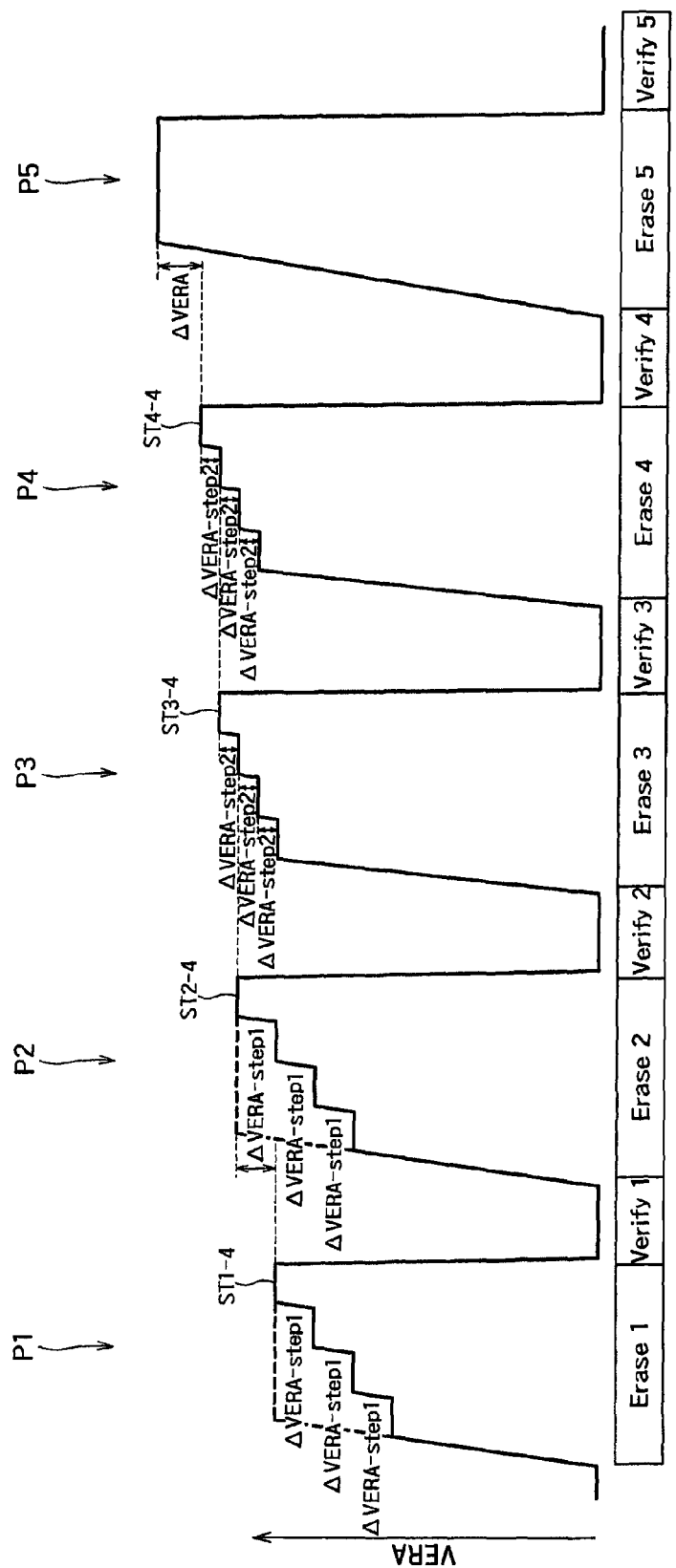
FIG. 15 is a waveform diagram showing still another example of a waveform of the erasure voltage output from the well control circuit in the erase operation of the memory cell.

Next, FIG. 15 is a waveform diagram showing another example of the waveform of the erase voltage output from the well control circuit in the erase operation of the memory cell.

As shown in FIG. 15, the step difference ($\Delta$VERA-step2) of the third and fourth erase voltages of the third and fourth pulse waves P3 and P4 that rise stepwise can be set to be smaller than the step difference ($\Delta$VERA-step1) of the first and second erase voltages of the first and second pulse waves P1 and P2 that rise stepwise.

In the example shown in FIG. 15, if it is verified in the erase verification ("Verify4") that erase of the memory cell M is not completed, the well control circuit 10 applies a fifth pulse wave P5 whose amplitude is a fifth erase voltage to the wells "Well(p)" and "Well(n)" ("Erase5").

The fifth erase voltage of the fifth pulse wave P5 is set to be higher than the final step (ST4-4) of the fourth erase voltage of the fourth pulse wave P4 by $\Delta$VERA.

As can be seen from FIG. 15, with regard to the rises stepwise between the first steps ST1-1, ST1-2, ST1-3 and ST4-1 of the first to fourth pulse waves, the rises stepwise between the first step ST1-2 of the second pulse wave P2 and the first step ST1-3 of the third pulse wave P3 is larger than the other rises stepwise. That is, if it is determined that the amount of charges stored in the charge accumulation layer has been reduced, and the electrical field stress on the tunnel insulating film has been reduced, the step difference is also reduced. As a result, the electrical field stress on the tunnel insulating film can be reduced, and the erase operation can be achieved in a shorter time.

(Application to Writing Voltage)

Cases where the first embodiment and the modifications 1 to 7 are applied to the writing operation will be described. Description of the same things as those in the erase operation will be omitted.

Figure 24:
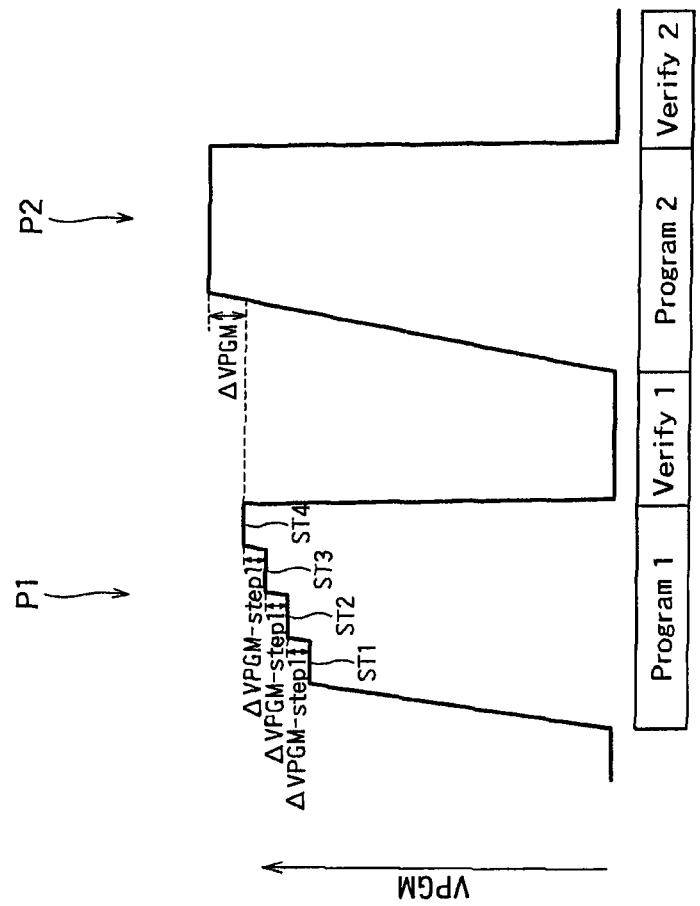
FIG. 24 is a waveform diagram showing an example of the waveform of the writing voltage output from the row decoder 6 in the writing operation of the memory cell corresponding to the erase operation of the memory cell.
Figure 25:
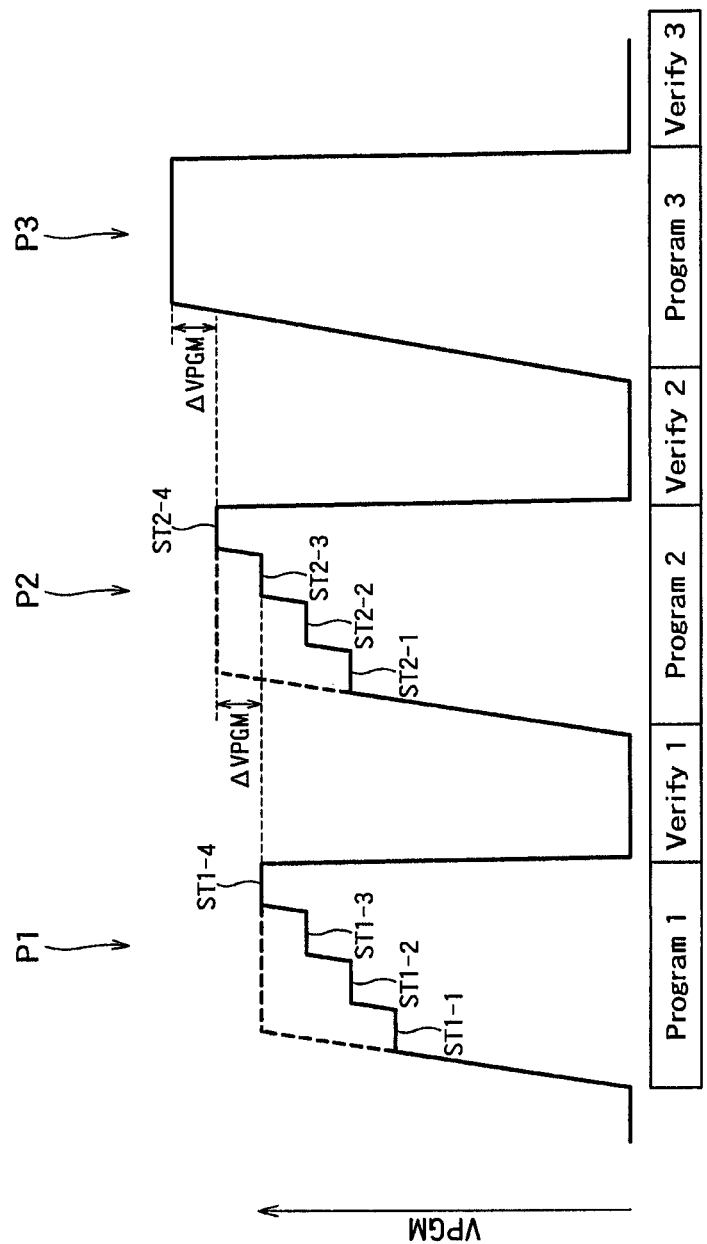
FIG. 25 is a waveform diagram showing still another example of the waveform of the writing voltage output from the row decoder 6 in the writing operation of the memory cell corresponding to the erase operation of the memory cell.
Figure 26:
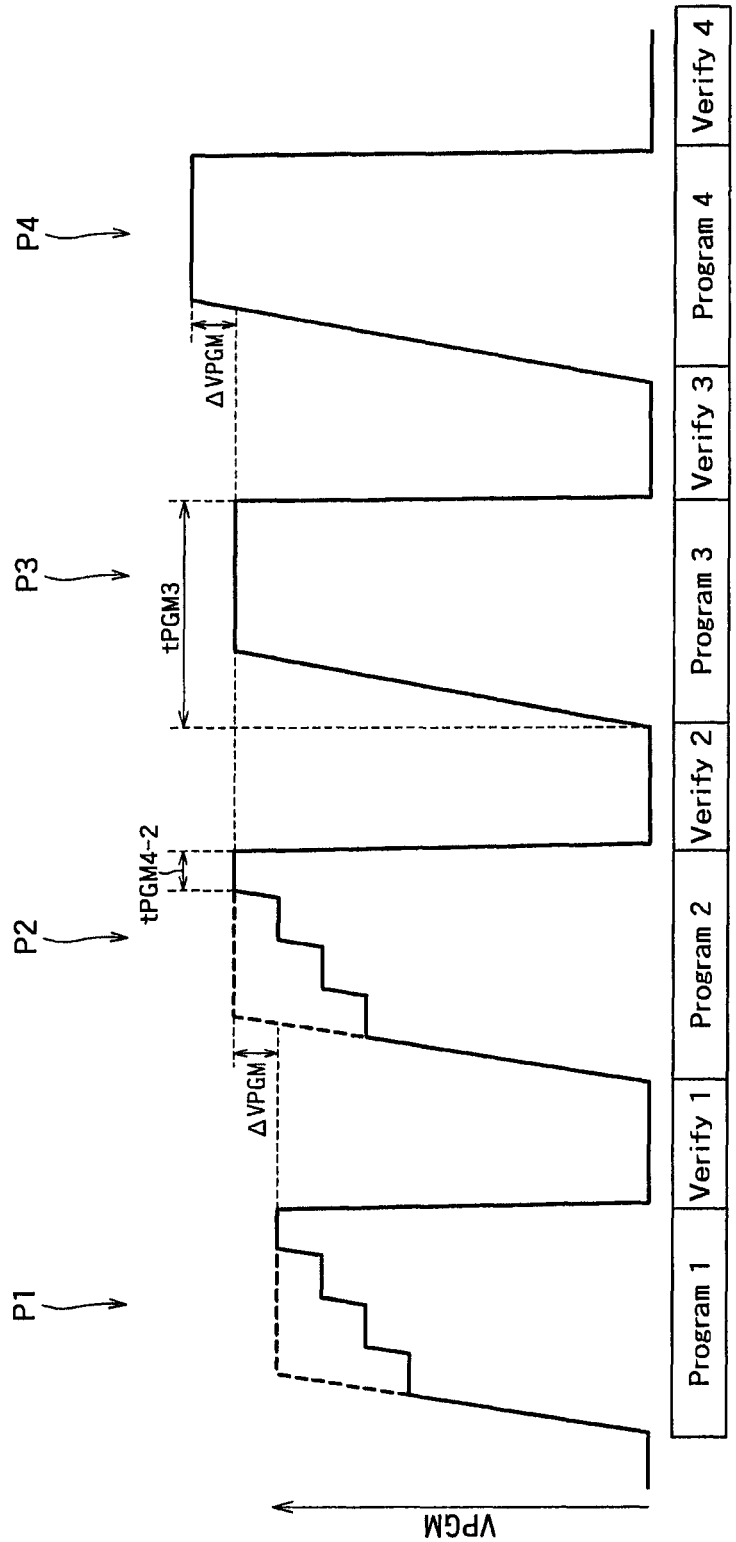
FIG. 26 is a waveform diagram showing still another example of the waveform of the writing voltage output from the row decoder 6 in the writing operation of the memory cell corresponding to the erase operation of the memory cell.
Figure 27:
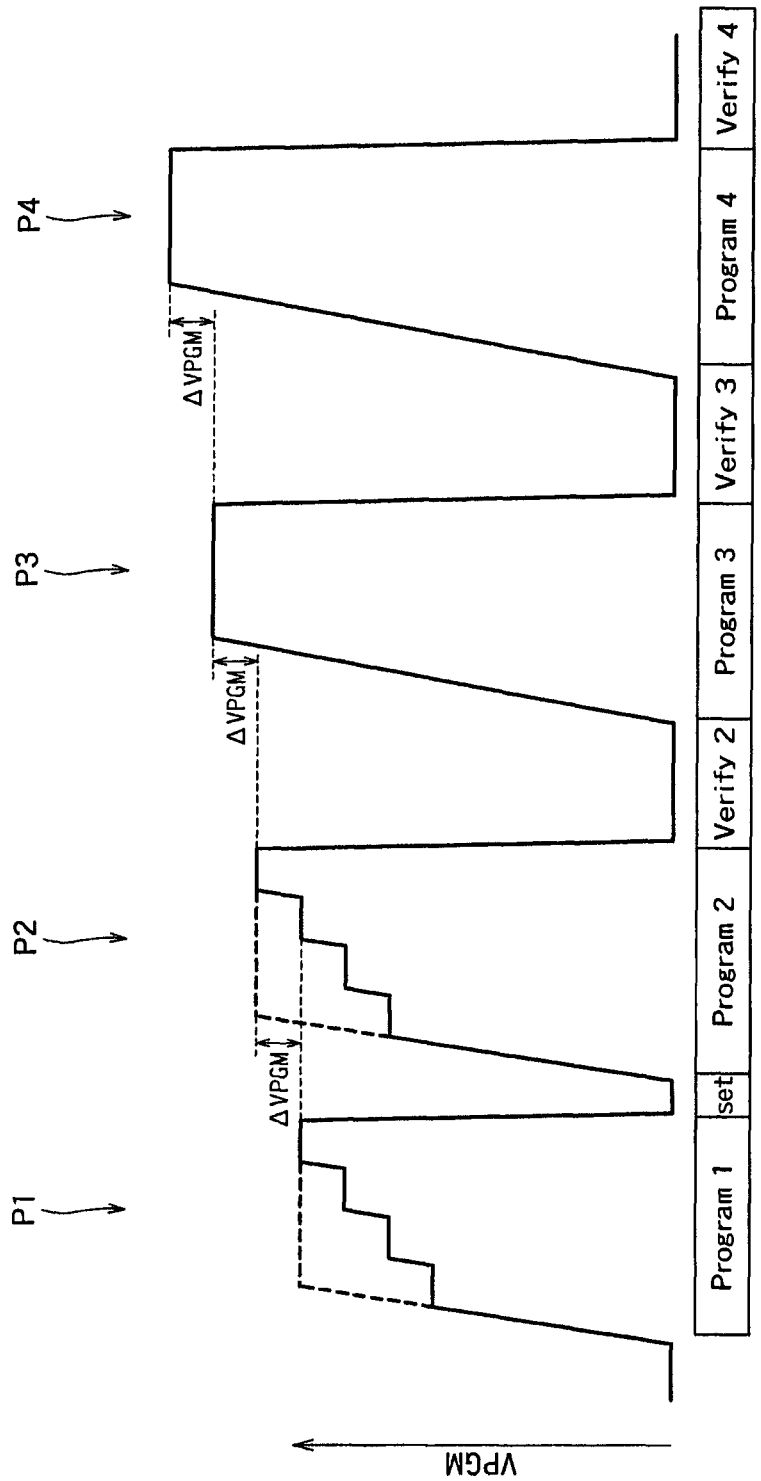
FIG. 27 is a waveform diagram showing still another example of the waveform of the writing voltage output from the row decoder 6 in the writing operation of the memory cell corresponding to the erase operation of the memory cell.
Figure 28:
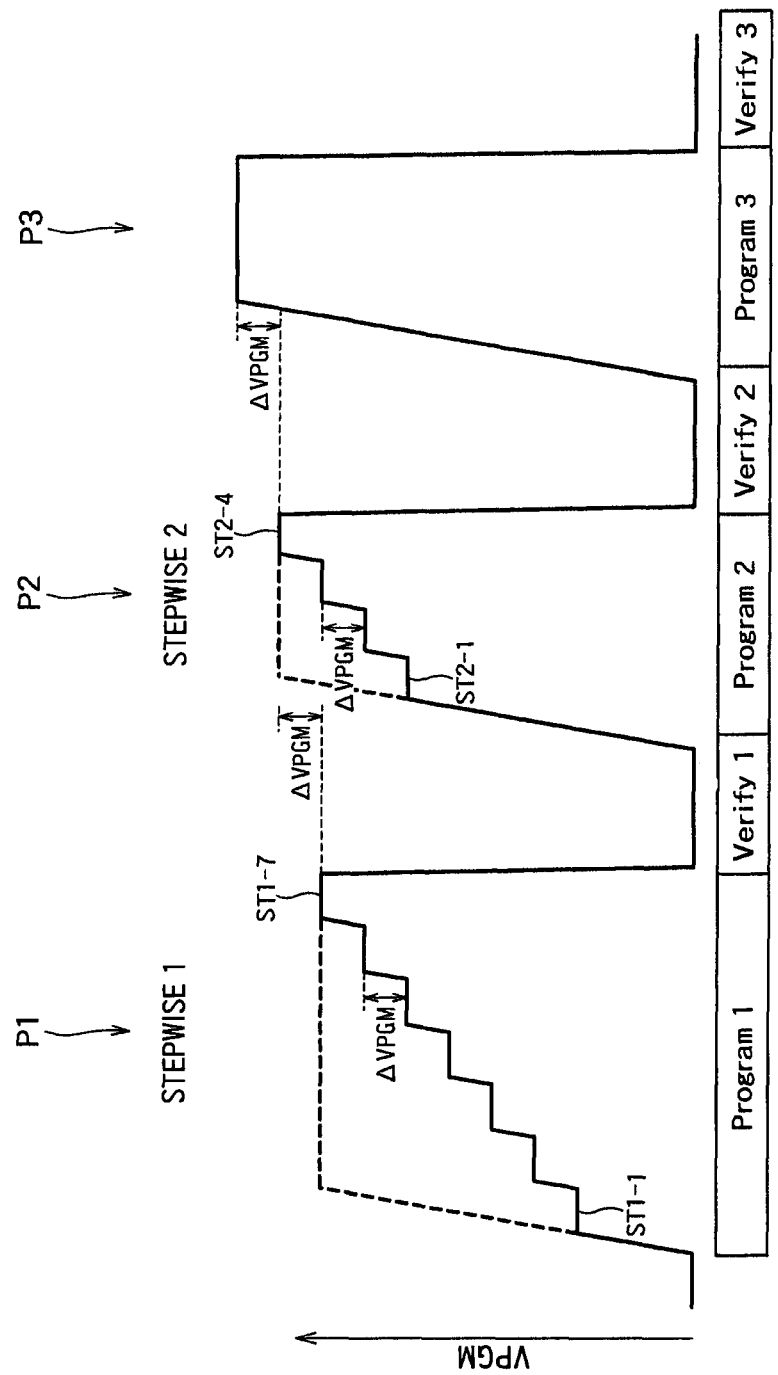
FIG. 28 is a waveform diagram showing still another example of the waveform of the writing voltage output from the row decoder 6 in the writing operation of the memory cell corresponding to the erase operation of the memory cell.
Figure 29:
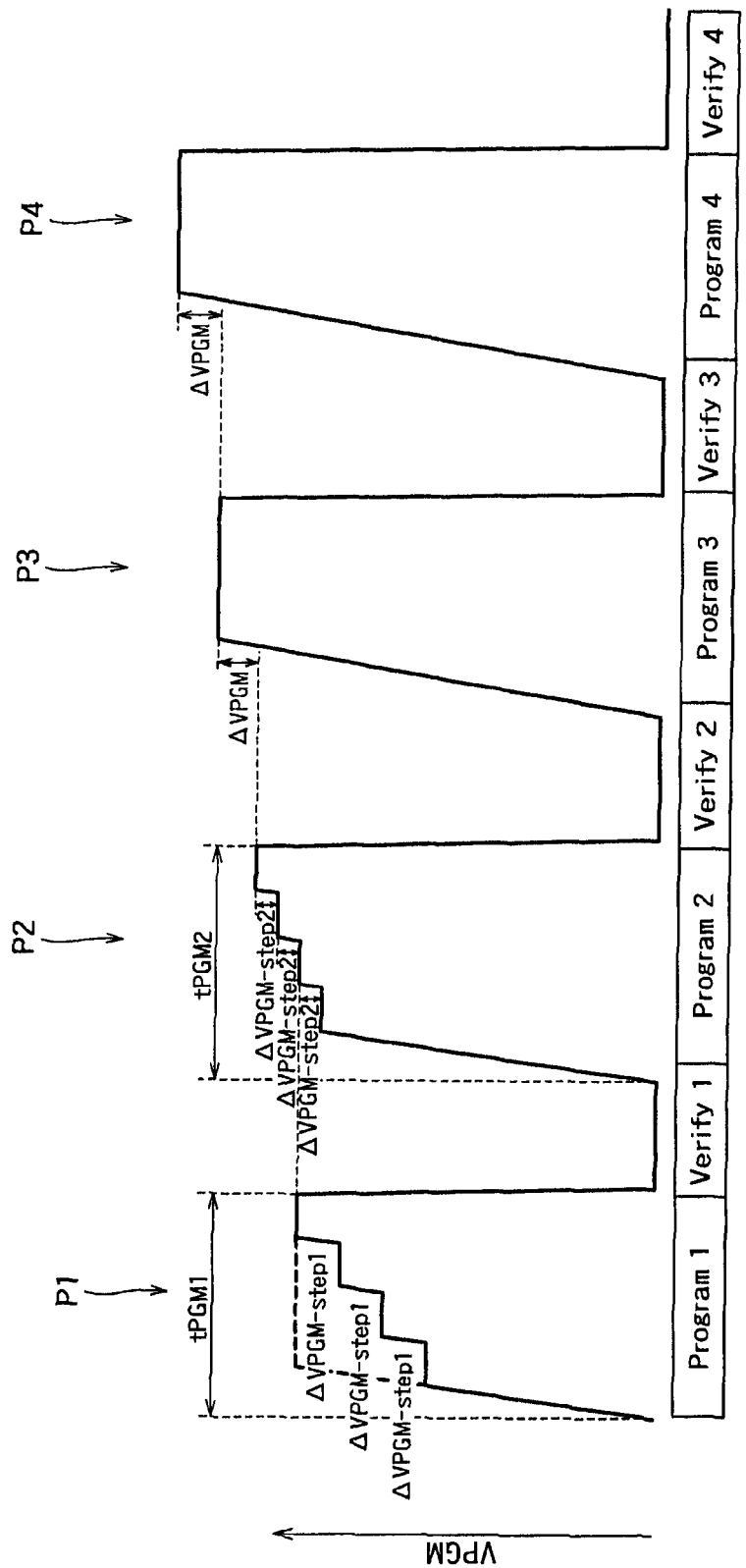
FIG. 29 is a waveform diagram showing still another example of the waveform of the writing voltage output from the row decoder 6 in the writing operation of the memory cell corresponding to the erase operation of the memory cell.
Figure 30:
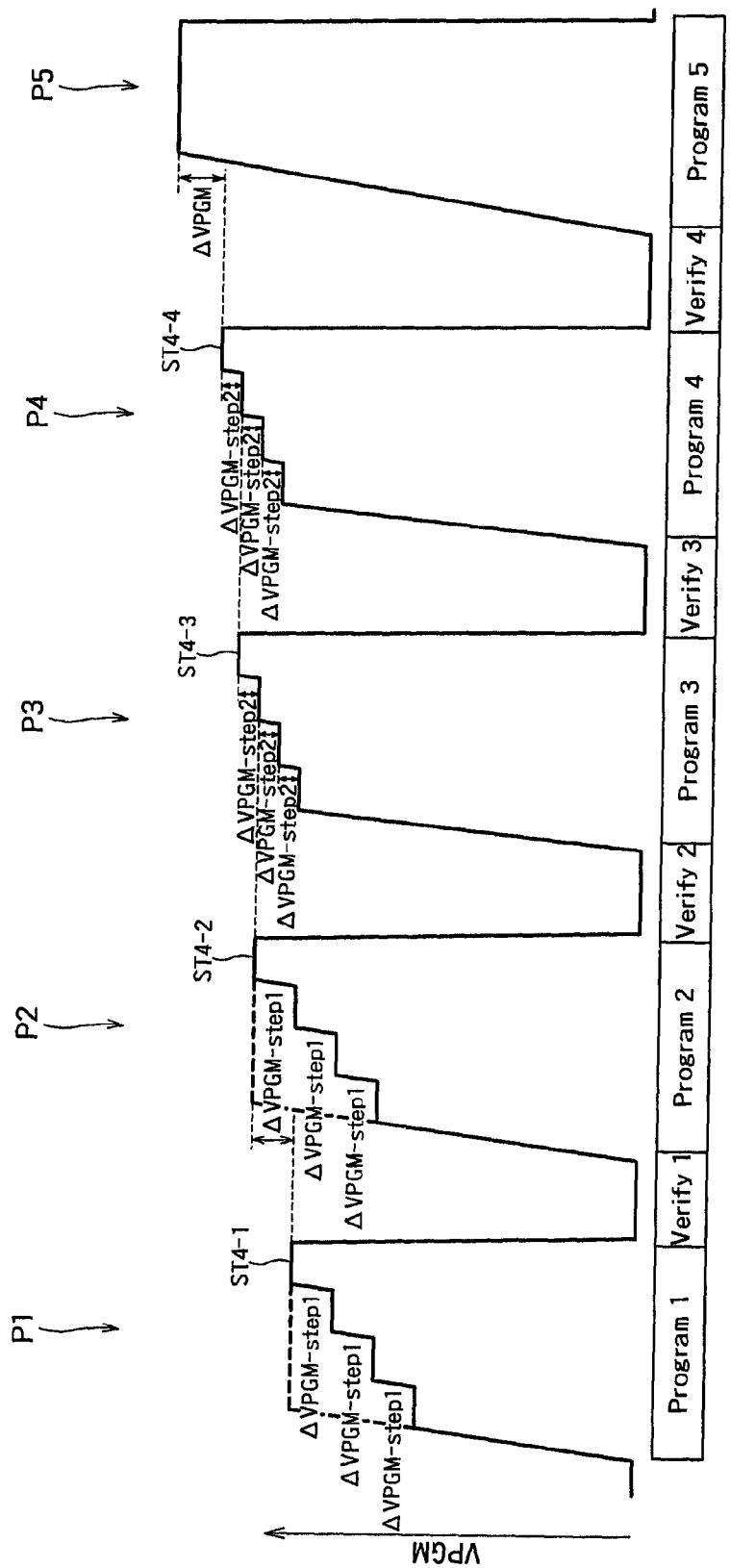
FIG. 30 is a waveform diagram showing still another example of the waveform of the writing voltage output from the row decoder 6 in the writing operation of the memory cell corresponding to the erase operation of the memory cell.

FIG. 24 is a waveform diagram showing an example of the waveform of the writing voltage output from the row decoder 6 in the writing operation of the memory cell corresponding to the erase operation of the memory cell according to the first embodiment.

In the writing operation of the memory cell M, the row decoder 6 sets the potential at the control gate CG of the memory cell M to be written at VPGM ("Program1").

Depending on the data to be written into the memory cell, the bit line control circuit 2 sets the bit line at "L", which may be 0V, for example, or "H", which may be 2.5V, for example.

Then, a writing verification is performed to verify whether writing of the memory cell M is completed or not ("Verify1"). If the memory cell M is not completed writing operation according to the writing verification ("Verify1"), the row decoder 6 applies the second pulse wave P2 whose amplitude is a second writing voltage to the control gate CG of the memory cell M to be written ("Program2"). After that, a writing verification is performed ("Verify2").

A first pulse width tPGM1 of the first pulse wave P1 is larger than a second pulse width tPGM2 of the second pulse wave P2, which is a substantially square wave. The second writing voltage is set to be higher than the first writing voltage by $\Delta$VPGM. The difference between the steps of the first pulse wave is $\Delta$VPGM.

Figure 34A:
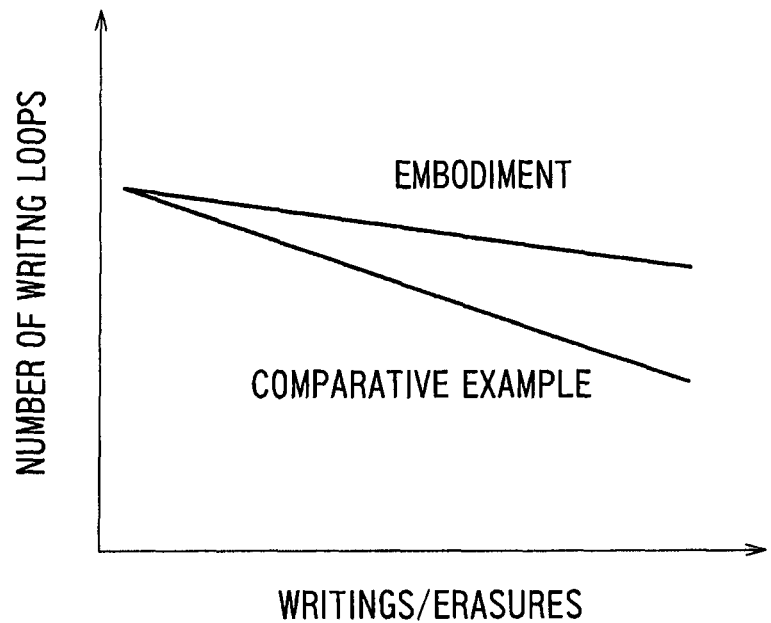
FIGS. 34A and 34B are diagrams showing relationships between the number of writing loops and the cumulative number of writings/erasures.

Since the pulse width tPGM1 of the stepwise first pulse wave P1, which is applied first, is larger than the second pulse width tPGM2 of the second pulse wave P2, a substantial amount of charges can be stored in the charge accumulation layer FG by application of the first pulse wave P1. Therefore, the second pulse width tPGM2 of the second pulse wave P2 can be reduced, thereby reducing the stress imposed on the tunnel insulating film by the second pulse wave P2, which is applied second. As a result, as shown in FIG. 34A, even if the cumulative number of writings/erases operations increases, the degree of decrease of the number of writing loops can be reduced. Therefore, over programming due to a substantial variation of the threshold voltage in response to one application of the writing voltage can be prevented.

FIGS. 24 to 30 show waveforms of the writing voltage in cases where the modifications 1 to 7 are applied to the writing operation, respectively. The operations can be inferred by analogy with the erase operation and therefore will not be described here. The advantages are also the same as those in the modifications 1 to 7 and will not be described here.

Second Embodiment

Figure 16:
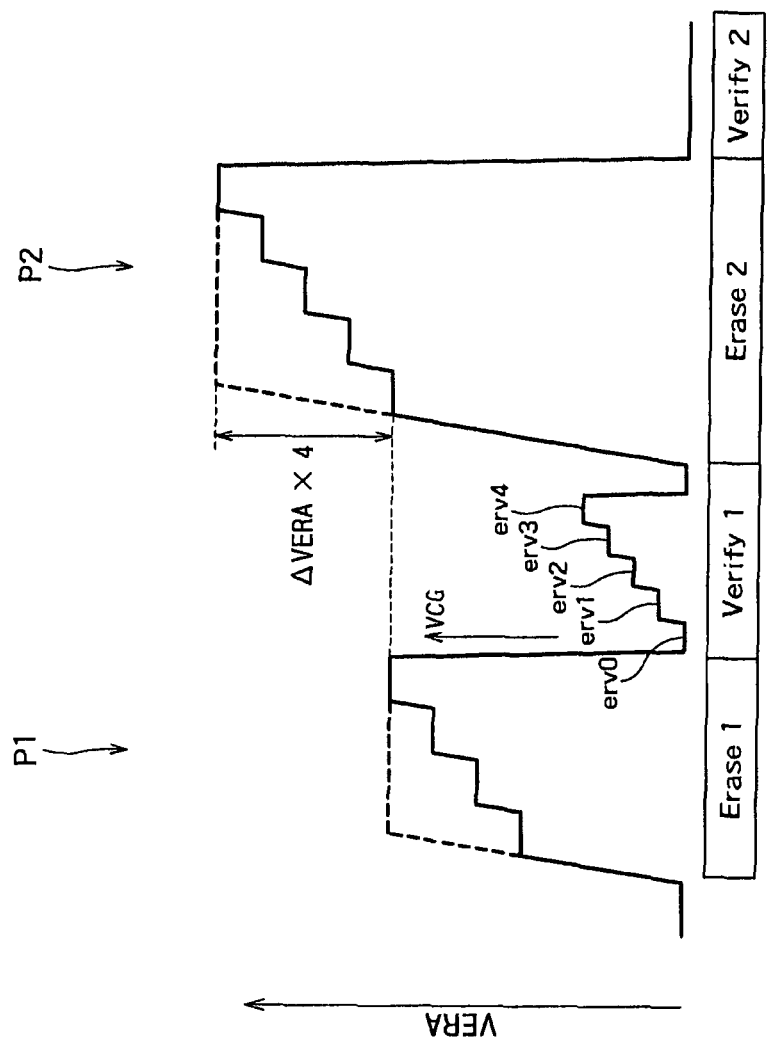
FIG. 16 is a waveform diagram showing still another example of a waveform of the erasure voltage output from the well control circuit in the erase operation of the memory cell.
Figure 17:
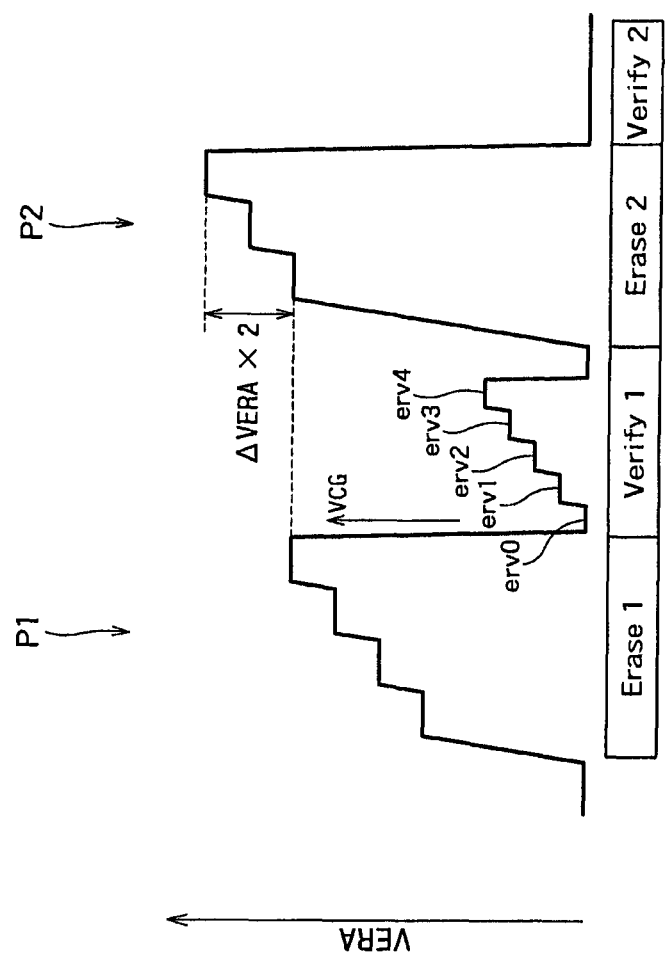
FIG. 17 is a waveform diagram showing still another example of a waveform of the erasure voltage output from the well control circuit in the erase operation of the memory cell.

A second embodiment will be described with reference to FIGS. 16 and 17. The second embodiment differs from the first embodiment in that the result of a verification operation is reflected in the pulse waveform of the next erase voltage. FIGS. 16 and 17 are waveform diagrams showing other examples of the waveform of the erase voltage output from the well control circuit in the erase operation of the memory cell.

In the examples shown in FIGS. 16 and 17, if the memory cell M is not completed erase operation according to the erase verification ("Verify1"), the well control circuit 10 changes the number of steps of the stepwise second pulse according to the level of the threshold voltage of the memory cell M.

For example, as shown in FIGS. 16 and 17, the level of erase of the memory cell M, that is, the level of the threshold voltage of the memory cell M is determined by raising stepwise the criterion voltage used in the erase verification ("Verify1"). According to the level of erase of the memory cell M, the number of steps of the next stepwise pulse wave is set.

That is, in the verification operation, a voltage VCG applied to the control gate is varied in five steps, which are referred to as criterion voltages "erv0" to "erv4". The criterion voltages "erv0" to "erv4" are used in turn to verify whether erase is completed. The higher the criterion voltage, the more easily the verification can be passed even if the amount of charges stored in the charge accumulation layer is large. In other words, the higher the criterion voltage, the higher the threshold voltage of the memory cell M is, and the more incompletely the memory cell M is erased.

In the example shown in FIG. 16, it is assumed that erase of the memory cell M is determined to be completed when the threshold voltage of the memory cell M is compared with the fifth criterion voltage "erv4". This means that application of a high erase voltage is needed to complete the erase. Therefore, the stepwise second pulse wave P2 is stepped up four times (ΔVERA by 4). Thus, the number of steps of the second pulse wave P2 is five.

In the example shown in FIG. 17, it is assumed that erase of the memory cell M is determined to be completed when the threshold voltage of the memory cell M is compared with the third criterion voltage "erv2". This means that application of a moderate erase voltage suffices to complete the erase operation. Therefore, the stepwise second pulse wave P2 is stepped up twice (ΔVERA by 2). Thus, the number of steps of the second pulse wave P2 is three.

Figure 18:
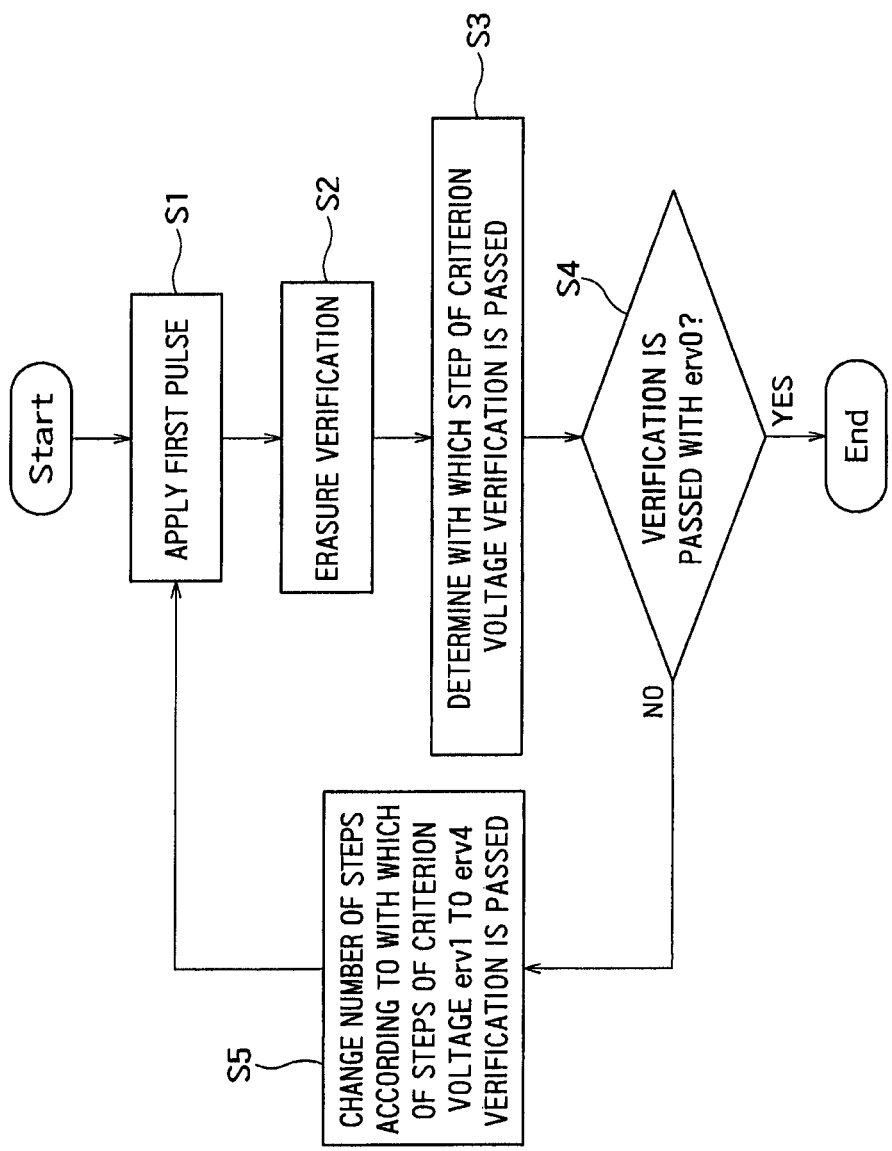
FIG. 18 is a diagram for illustrating an example of a process flow of setting the number of steps of the second pulse according to the result of the erase verification.
Figure 19:
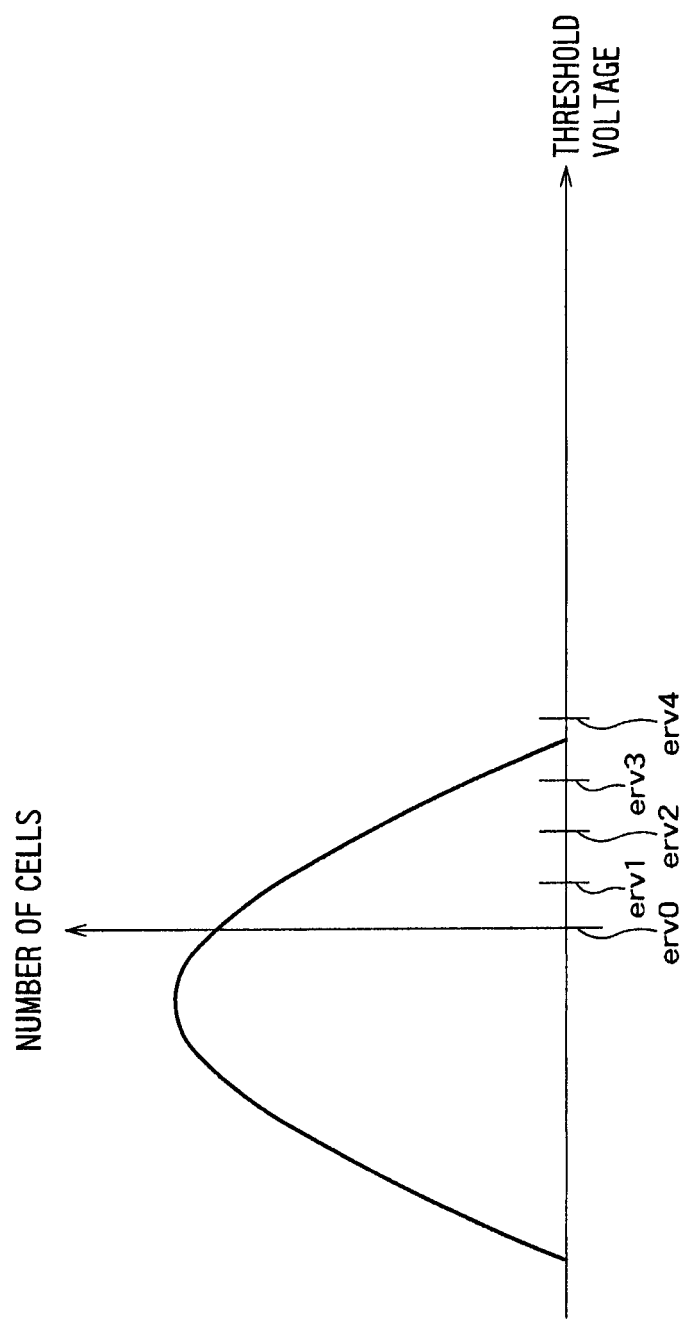
FIG. 19 is a diagram showing an example of a distribution of the threshold voltage of the memory cell after the first pulse wave P1 of the erasure voltage is applied.
Figure 20:
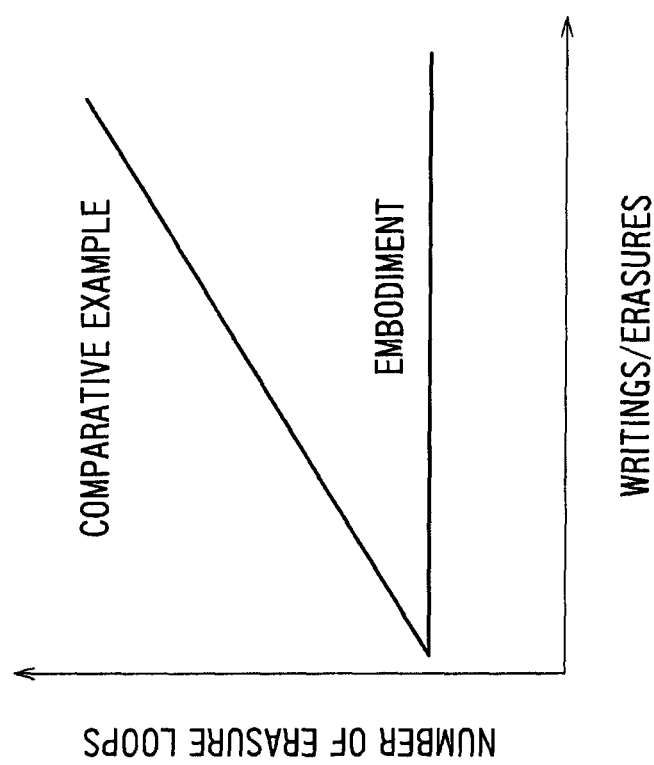
FIG. 20 is a diagram showing a relationship between the number of erasure loops and the cumulative number of writings/erasures.

FIG. 18 is a diagram for illustrating an example of a process flow of setting the number of steps of the second pulse according to the result of the erase verification. FIG. 19 is a diagram showing an example of a distribution of the threshold voltage of the memory cell after the first pulse wave P1 of the erase voltage is applied. FIG. 20 is a diagram showing a relationship between the number of erase loops and the cumulative number of writings/erases operations. The controls or determinations in the steps shown in the flowchart are performed by the control circuit 7, for example.

As shown in FIG. 18, first, the well control circuit 10 applies the first pulse wave P1 to the wells "Well(p)" and "Well(n)" (Step S1).

Then, the erase verification is performed by raising the criterion voltage for the erase verification stepwise (in five steps, for example) (Step S2).

Then, it is determined in which of the five steps of the criterion voltage the erase verification is passed (Step S3).

This determination shows to which of the five steps of the criterion voltage the threshold voltage of the memory cell M corresponds.

In the example shown in FIG. 19, of the five criterion voltages (0V ("erv0"), "erv1" to "erv4"), the erase verification is passed with the fifth criterion voltage "erv4".

If the erase verification is passed with the criterion voltage "erv0", it is determined that the erase of the memory cell M is completed, and the erase operation ends (Step S4).

Then, the well control circuit 10 determines the number of steps of the next pulse wave (the second pulse wave P2 in this example) according to with which step of the criterion voltage "erv1" to "erv4" the erase verification is passed (Step S5).

Then, an erase voltage with a pulse waveform according to the number of pulses determined in step S5 is applied to the wells "Well(p)" and "Well(n)" (Step S1 from Step S5).

In this way, an optimum second pulse wave of the erase voltage can be applied to the wells "Well(p)" and "Well(n)" by changing the number of steps of the stepwise second pulse according to the result of the erase verification. As a result, as shown in FIG. 20, the number of erase loops can be further reduced. In FIG. 20, in the comparative example, the erase operation is performed using only substantially square waves. As described above, the second pulse wave is adjusted based on with which step of the criterion voltage the erase verification is passed. Therefore, the erase operation can be completed with minimum application of the second pulse wave. That is, as shown in FIG. 20, the number of erase loops does not increase. As a result, even if the cumulative number of writings/erases operations increases, the erase operation can be achieved in a shorter time.

(Modification 1)

Figure 21:
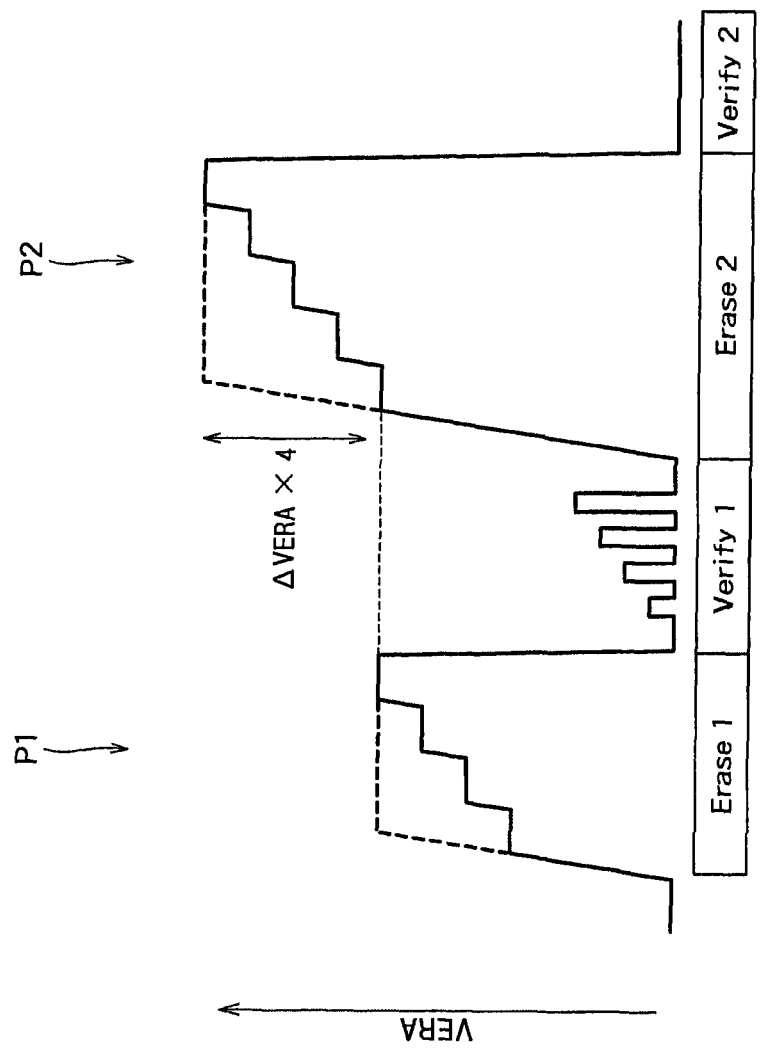
FIG. 21 is a waveform diagram showing other example of the waveform of the erasure voltage output from the well control circuit in the erase operation of the memory cell.
Figure 22:
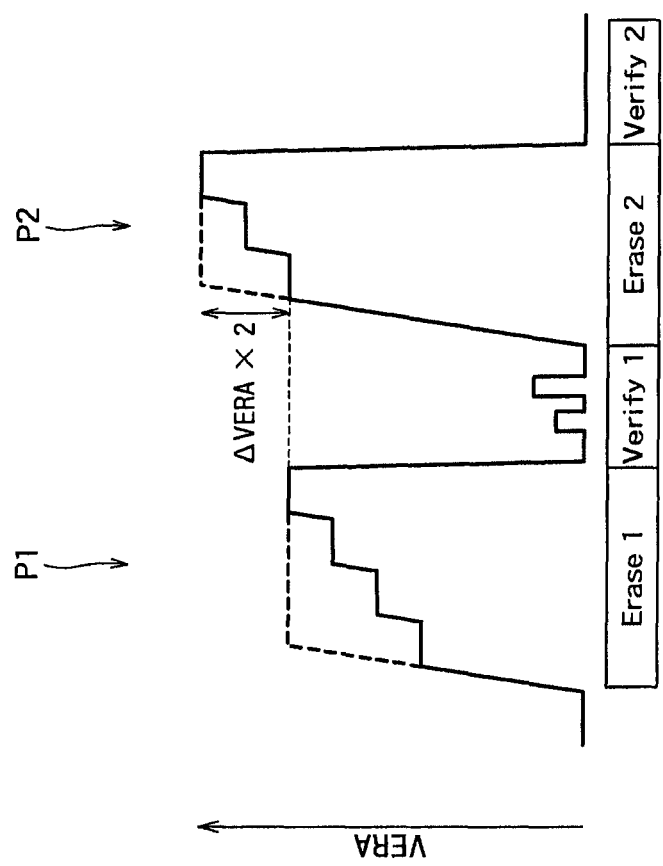
FIG. 22 is a waveform diagram showing other example of the waveform of the erasure voltage output from the well control circuit in the erase operation of the memory cell.

Next, FIGS. 21 and 22 are waveform diagrams showing other examples of the waveform of the erase voltage output from the well control circuit in the erase operation of the memory cell.

Figure 23:
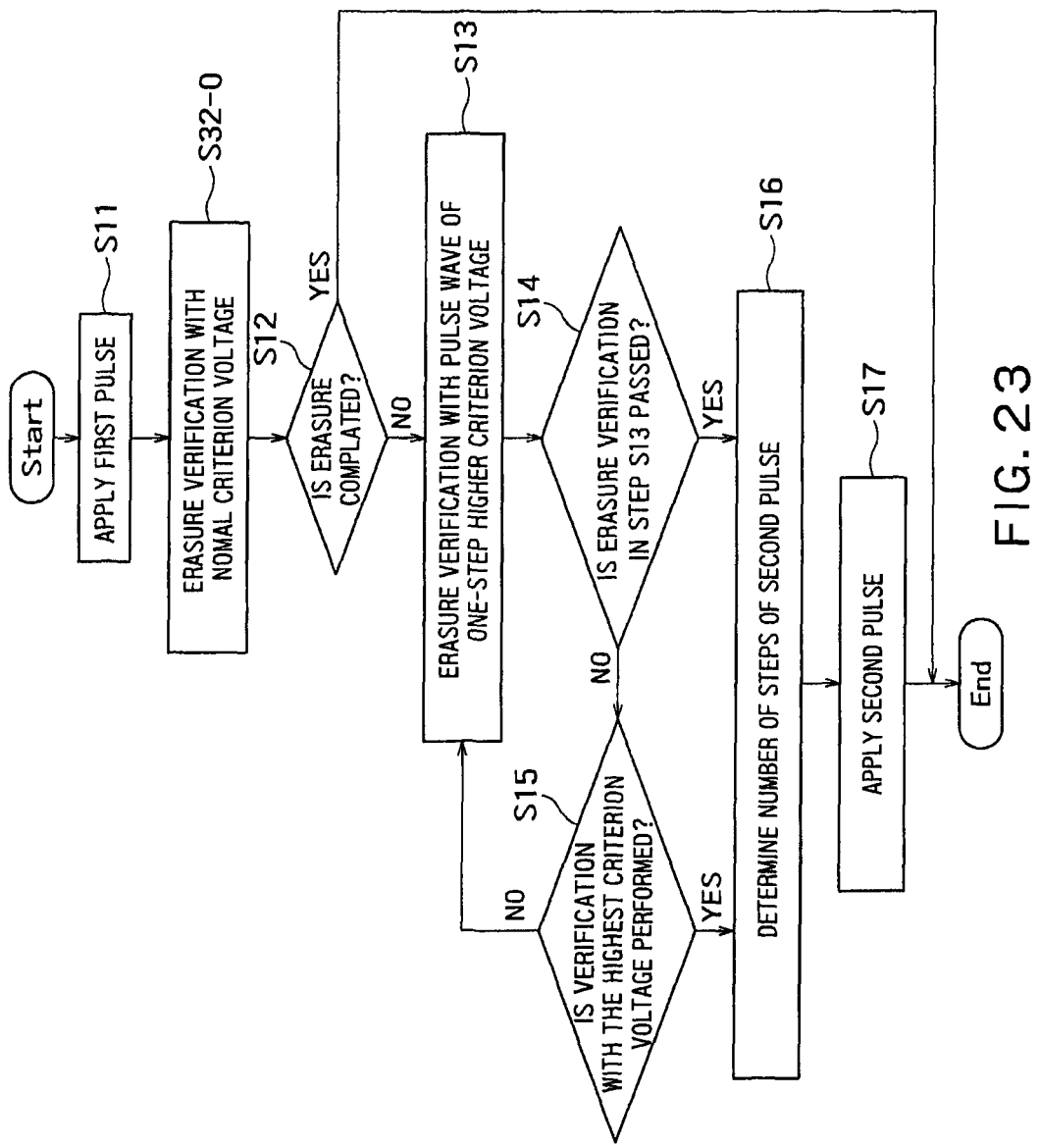
FIG. 23 is a diagram for illustrating an example of a process flow of setting the number of steps of the second pulse according to the result of the erase verification.

In the examples shown in FIGS. 21 and 22, the memory cell M is not completed erase operation according to the erase verification ("Verify1"), the well control circuit 10 changes the number of steps of the stepwise second pulse according to the level of the threshold voltage of the memory cell M in the same way as the example described above. However, unlike the example described above, whether the erase verification is passed or not is determined for each step of the criterion voltage. FIG. 23 is a flowchart for illustrating this modification. The controls or determinations in the steps shown in the flowchart are performed by the control circuit 7, for example.

As shown in FIG. 22, first, the well control circuit 10 applies the first pulse wave P1 to the wells "Well(p)" and "Well(n)" (Step S11).

Then, the erase verification is performed with a normal criterion voltage ("erv0" shown in FIG. 19, for example) (Step S12-0), and if it is verified that the erase of the memory cell M is completed, the erase operation ends (Step S12).

If the memory cell M is not completed erase operation according to the erase verification, the erase verification is performed with a pulse wave of a one-step higher criterion voltage ("erv1" shown in FIG. 19, for example) (Step S13).

Then, it is determined whether the erase verification in step S13 is passed or not (Step S14). If it is determined that this erase verification is not passed, it is determined whether verification with the highest criterion voltage has been performed or not (Step S15). If it is determined in Step S15 that verification with the highest criterion voltage has not been performed, the operation returns to Step S13, and the erase verification is performed with a one-step higher criterion voltage ("erv2" shown in FIG. 19, for example).

If it is determined that the erase verification in Step S13 is passed, or if verification with the highest criterion voltage ("erv4", for example) has been performed, the well control circuit 10 determines the next pulse wave whose number of steps is determined by the criterion voltage at which the erase verification is passed (the second pulse wave P2 in this example) (Step S16). Then, the erase operation is performed by applying the second pulse wave with the determined number of steps to the wells "Well(p)" and "Well(n)" (Step S17).

After Step S17, the erase operation ends. Alternatively, the process may return to Step S12 after Step S17. In this case, the erase verification is performed with the normal criterion voltage, and then, if the erase of the memory cell M is completed, the erase operation ends. If the erase of the memory cell M is not completed, the same flow as described above is repeated until the erase of memory cell M is completed. That is, a third pulse wave whose number of pulse steps is adjusted based on the result of application of the second pulse wave is applied. In this way, the memory cell M can be erased with reliability.

FIGS. 21 and 22 show examples of the pulse waveform used in this erase operation. As shown in FIGS. 21 and 22, whether the erase verification is passed or not is determined for each criterion voltage used in the erase verification ("Verify1"). That is, the level of the erase of the memory cell M or, in other words, the level of the threshold voltage of the memory cell M is determined for each criterion voltage, the erase verification is terminated when the erase verification is passed, and the number of steps of the second pulse is determined based on the criterion voltage at that time.

In the example shown in FIG. 21, the threshold voltage of the memory cell M passes the erase verification with the fifth criterion voltage ("erv4"), and therefore, the number of steps of the stepwise second pulse is set at four ($\Delta$VERA by 4).

In the example shown in FIG. 22, the threshold voltage of the memory cell M passes the erase verification with the third criterion voltage ("erv2"), and therefore, the number of steps of the stepwise second pulse is set at two ($\Delta$VERA by 2). In this way, an optimum second pulse wave of the erase voltage can be applied to the wells "Well(p)" and "Well(n)" by changing the number of steps of the stepwise second pulse according to the result of the erase verification, and as a result, as shown in FIG. 20 described above, the number of erase loops can be reduced. In addition, according to this erase verification method, the erase operation can be achieved in a shorter time. For example, when the cumulative number of writings/erases operation is small (when the erase pulse is applied for the first time, for example), one application of the erase pulse brings the threshold voltage of the memory cell M close to the completely erased state, so that the erase verification is passed with a low criterion voltage. Specifically, FIG. 22 shows a case where the cumulative number of writings/erases operations is small, and FIG. 21 shows a case where the cumulative number of writings/erases operations is large. Thus, when the cumulative number of writings/erases operations is small, the erase verification can be terminated earlier, and thus, the erase operation can be achieved in a shorter time.

As described above, the semiconductor storage device according to the embodiment 2 can be prevented from suffering reliability degradation due to repetition of writings/operation s operations.

(Application to Writing Voltage)

Cases where the second embodiment and the modification 1 are applied to the writing operation will be described. Description of the same things as those in the erase operation will be omitted.

Figure 31:
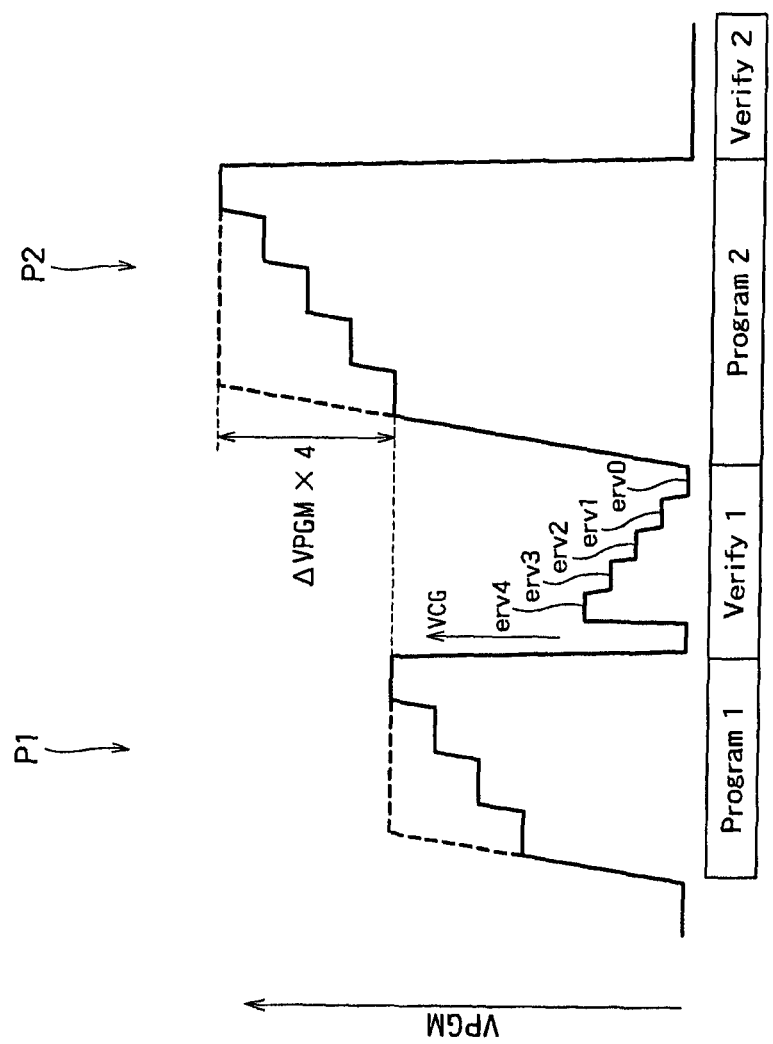
FIG. 31 is a waveform diagram showing still another example of the waveform of the writing voltage output from the row decoder 6 in the writing operation of the memory cell corresponding to the erase operation of the memory cell.
Figure 32:
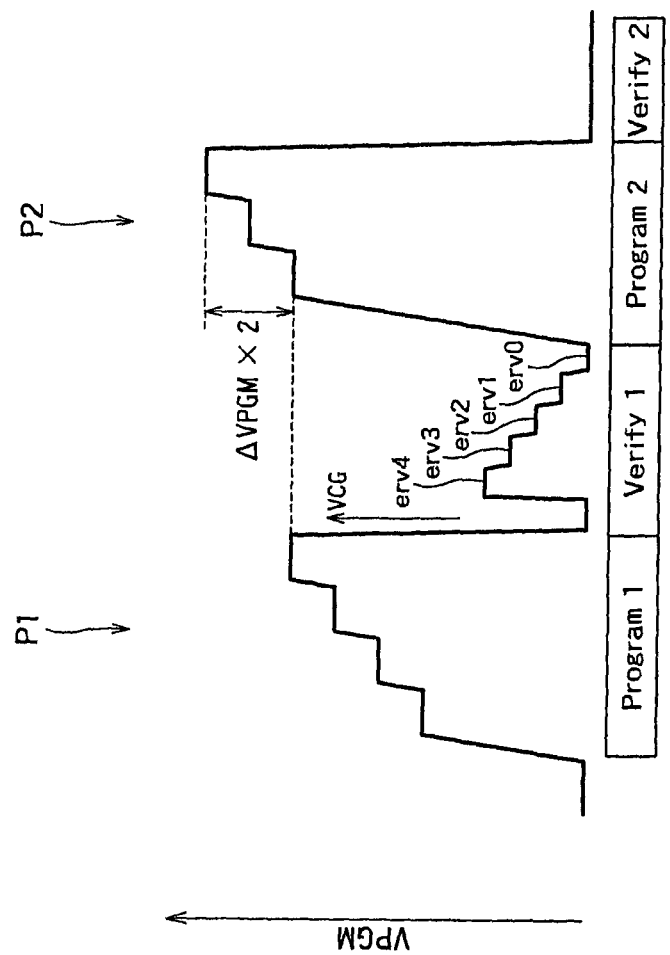
FIG. 32 is a diagram for illustrating an example of a process flow of setting the number of steps of the second pulse according to the result of the writing verification.

FIGS. 31 and 32 are waveform diagrams showing examples of the waveform of the writing voltage output from the row decoder 6 in the writing operation of the memory cell corresponding to the erase operation of the memory cell according to the second embodiment.

In the writing operation of the memory cell M, the row decoder 6 sets the potential at the control gate CG of the memory cell M to be written at VPGM ("Program1").

Depending on the data to be written into the memory cell, the bit line control circuit 2 sets the bit line at "L", which may be 0V, for example, or "H", which may be 2.5V, for example.

For example, the level of writing of the memory cell M or, in other words, the level of the threshold voltage of the memory cell M is determined by raising the criterion voltage used for the writing verification ("Verify1") stepwise as shown in FIGS. 31 and 32. Depending on the level of writing of the memory cell M, the number of steps of the next stepwise pulse wave is set.

That is, in the writing operation, the voltage VCG applied to the control gate is varied in five steps, which are referred to as criterion voltages "erv0" to "erv4". The criterion voltages "erv0" to "erv4" are used in turn to verify whether writing is completed. The lower the criterion voltage, the more easily the verification can be passed even if the amount of charges stored in the charge accumulation layer is small. In other words, the lower the criterion voltage, the lower the threshold voltage of the memory cell M is, and the more incompletely the memory cell M is written.

In the example shown in FIG. 31, it is assumed that writing of the memory cell M is determined to be completed when the threshold voltage of the memory cell M is compared with the second criterion voltage "erv1". This means that application of a high writing voltage is needed to complete the writing. Therefore, the voltage of the stepwise second pulse wave P2 is stepped up four times ($\Delta$VERA by 4). Thus, the number of steps of the second pulse wave P2 is five.

In the example shown in FIG. 32, it is assumed that writing of the memory cell M is determined to be completed when the threshold voltage of the memory cell M is compared with the fifth criterion voltage "erv4". This means that application of a moderate writing voltage suffices to complete the writing. Therefore, the stepwise second pulse wave P2 is stepped up twice ($\Delta$VERA by 2). Thus, the number of steps of the second pulse wave P2 is three.

Figure 33:
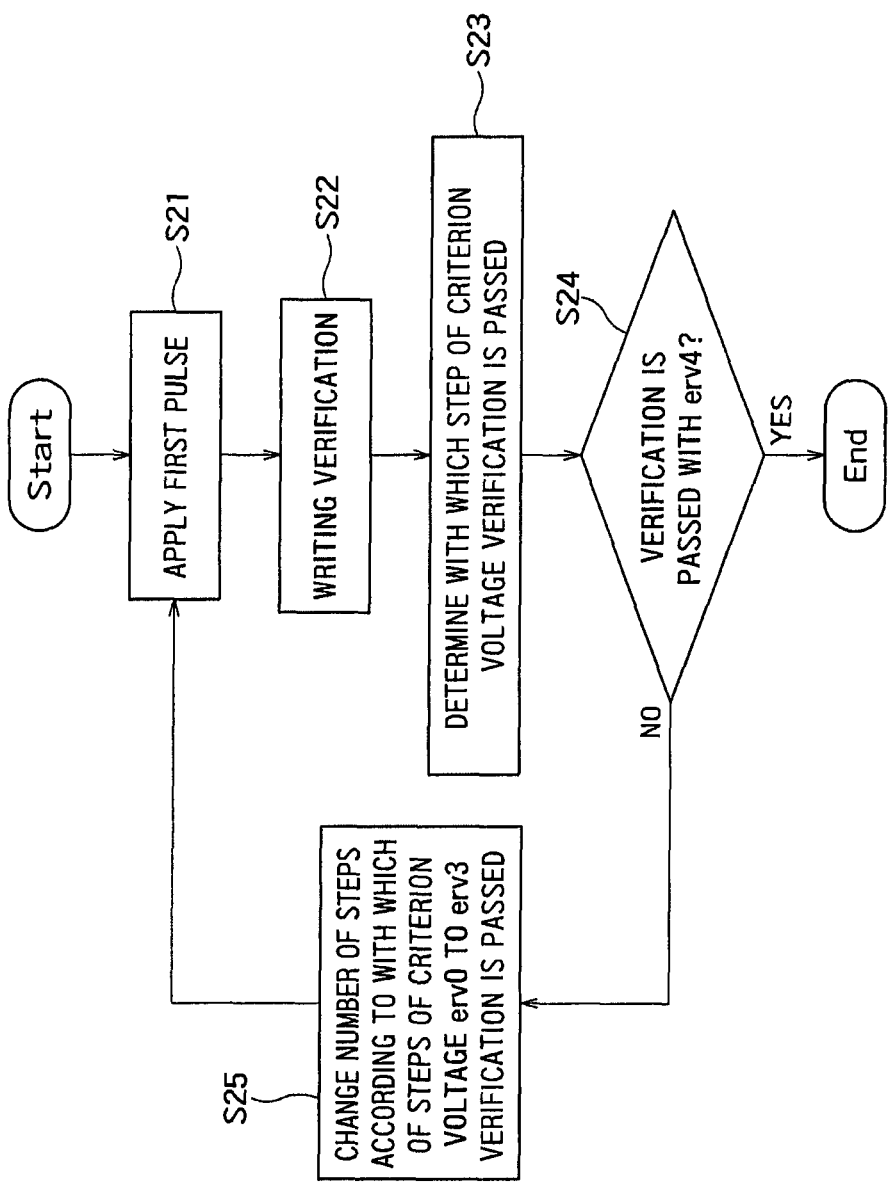
FIG. 33 is a diagram for illustrating an example of a process flow of setting the number of steps of the second pulse according to the result of the writing verification.
Figure 34B:
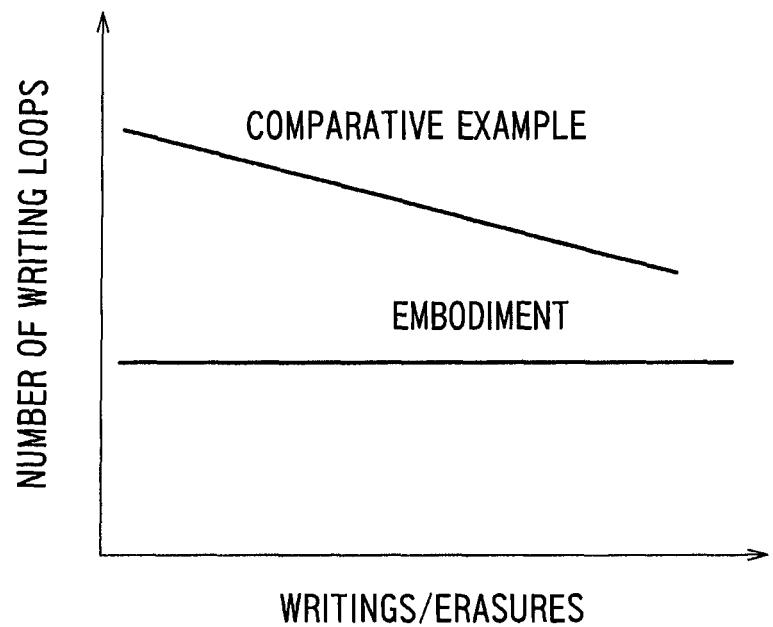

FIG. 33 is a diagram for illustrating an example of a process flow of setting the number of steps of the second pulse according to the result of the writing verification. FIG. 34B is a diagram showing a relationship between the number of writing loops and the cumulative number of writings/erases operations. The controls or determinations in the steps shown in the flowchart are performed by the control circuit 7, for example.

Steps S21 and S23 to S25 shown in FIG. 33 can be inferred by analogy with the corresponding steps shown in FIG. 18 and therefore will not be described here.

In step S22, the writing verification is performed by lowering the criterion voltage stepwise (in five steps, for example).

The five criterion voltages are the same as in the example shown in FIG. 19, and therefore, descriptions thereof will be omitted.

An optimum second pulse wave of the writing voltage can be applied to the control gate CG by changing the number of steps of the stepwise second pulse according to the result of the writing verification.

That is, the second pulse wave is adjusted based on with which step of the criterion voltage the writing verification is passed. Therefore, the writing operation can be completed with minimum application of the second pulse wave. That is, as shown in FIG. 34B, when the cumulative number of writings/erases operations is small, the number of writing loops can be reduced. As a result, when the cumulative number of writings/erases operations is small, the writing operation can be achieved in a shorter time. Even if the cumulative number of writings/erases operations increases, the degree of decrease of the number of writing loops can be reduced. As a result, over programming due to a substantial variation of the threshold voltage in response to one application of the writing voltage can be prevented.

In particular, in the case where the data to be stored is binary data, where the data to be stored is multi-value data, or where an intermediate threshold voltage between the two values of binary data is to be written, the writing operation can be completed in a shorter time.

As the cumulative number of writings/erases operations increases, the tunnel insulating film degrades, and the threshold voltage of the memory cell more easily rises in response to a low writing voltage. Therefore, if the writing voltage is not adjusted, there is a possibility that over programming occurs, and the memory cell M cannot properly store data. However, according to this embodiment, the writing operation can be completed with minimum application of the second pulse wave. As a result, over programming can be prevented.

(Modification 1)

Figure 35:
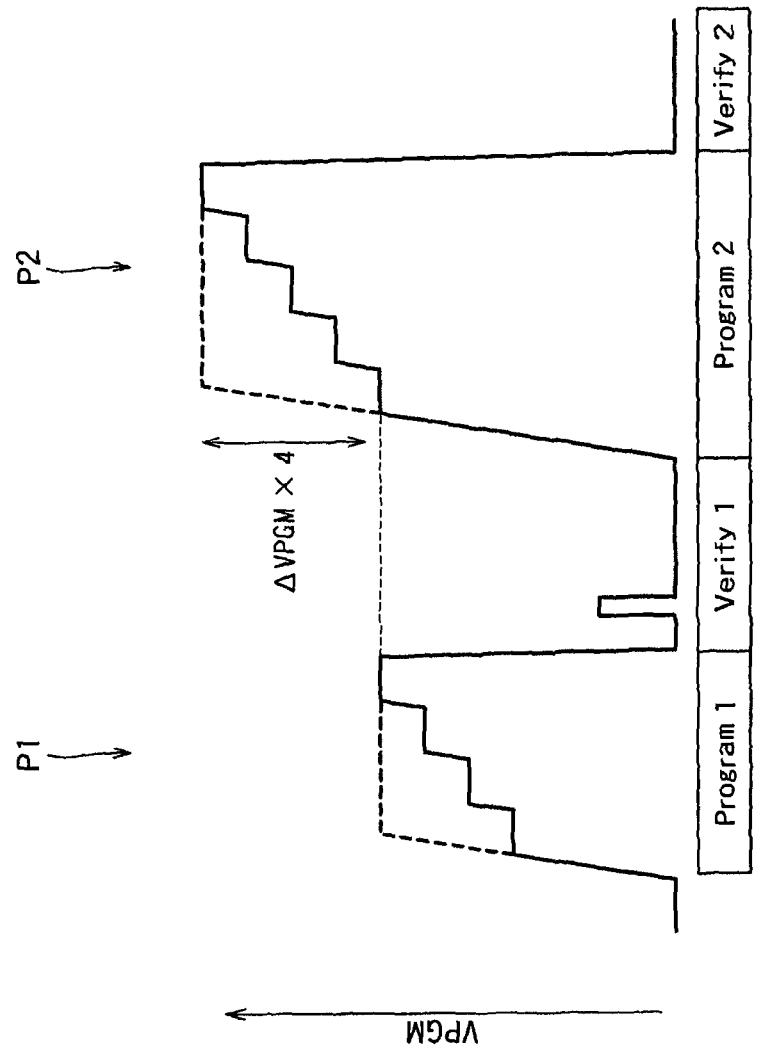
FIG. 35 is a waveform diagram showing still another example of the waveform of the writing voltage output from the row decoder 6 in the writing operation of the memory cell corresponding to the erase operation of the memory cell.
Figure 36:
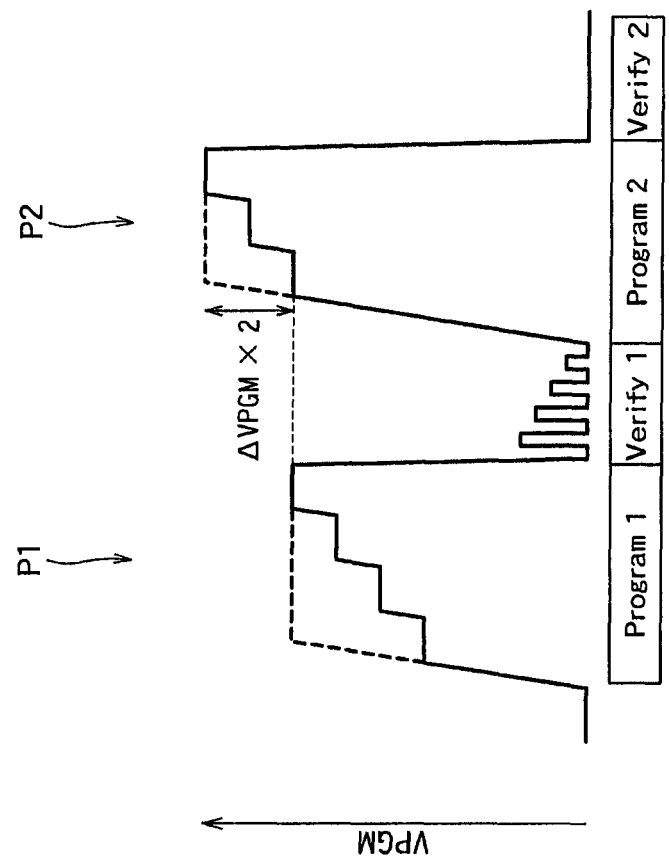
FIG. 36 is a waveform diagram showing still another example of the waveform of the writing voltage output from the row decoder 6 in the writing operation of the memory cell corresponding to the erase operation of the memory cell.

Next, FIGS. 35 and 36 are waveform diagrams showing other examples of the waveform of the writing voltage output from the row decoder in the writing operation of the memory cell.

Figure 37:
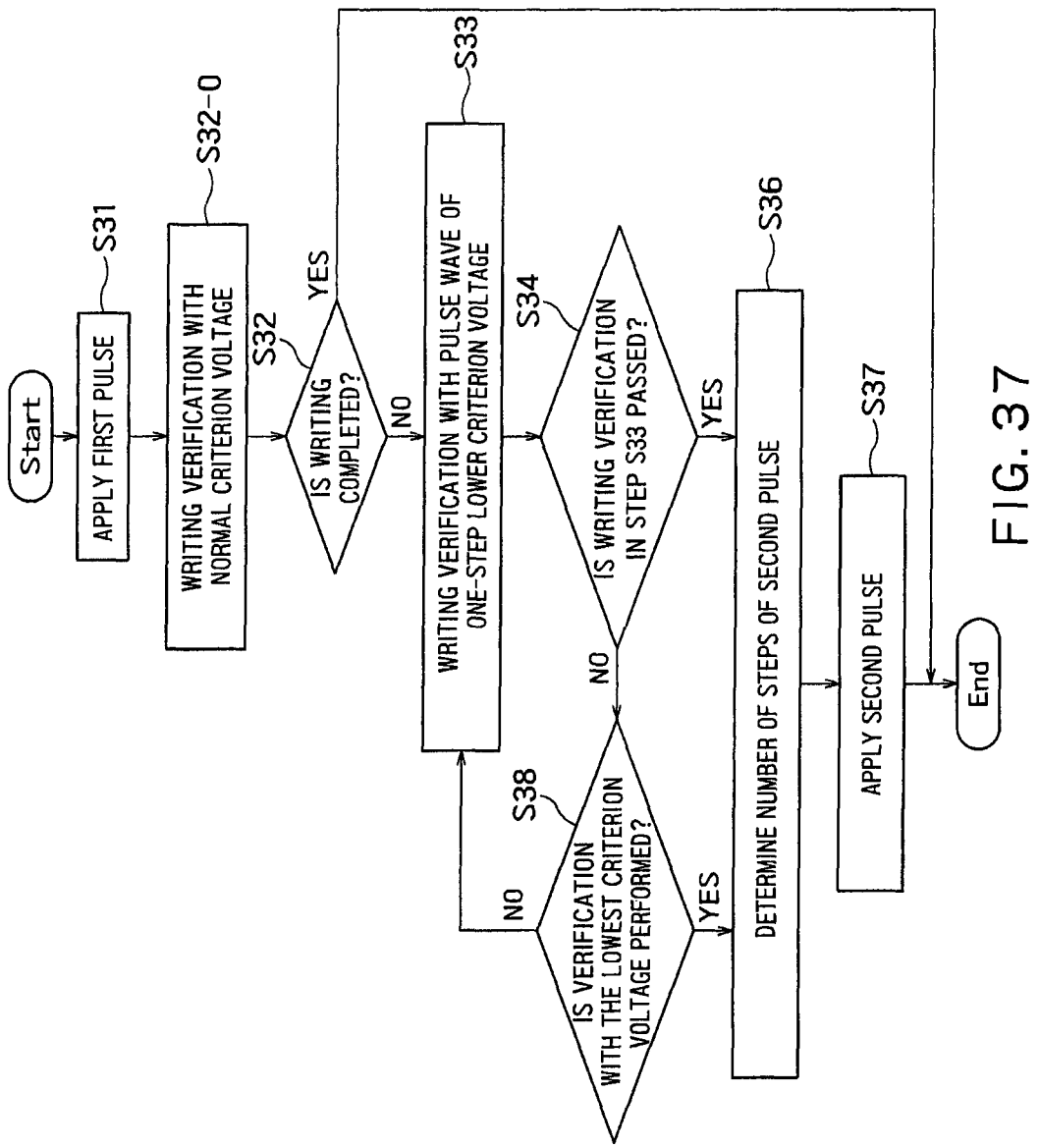
FIG. 37 is a diagram for illustrating an example of a process flow of setting the number of steps of the second pulse according to the result of the writing verification.

This modification differs from the example described above in that whether the writing verification is passed or not is determined for each criterion voltage. FIG. 37 is a flowchart for illustrating this modification. The controls or determinations in the steps shown in the flowchart are performed by the control circuit 7, for example.

FIG. 37 is basically the same as FIG. 22 except that the erase verification is replaced with the writing verification, and therefore, descriptions thereof will be omitted. The writing verification with a normal criterion voltage (Step S32-0) is performed with a criterion voltage "erv4". If writing of the memory cell M is not completed, the writing verification is performed with a pulse wave of a one-step lower criterion voltage ("erv3" in FIG. 36, for example) (Step S33).

Then, it is determined whether the writing verification in Step S33 is passed or not (Step S34). If the writing verification is not passed, it is determined whether verification with the lowest criterion voltage has been performed or not (Step S38). If it is determined in Step S38 that the verification with the lowest criterion voltage has not been performed, the process returns to Step S33, and the writing verification with a one-step lower criterion voltage ("erv2" in FIG. 19, for example) is performed.

If it is determined in Step S34 that the writing verification in Step S33 is passed, or if the writing verification with the lowest criterion voltage ("erv0", for example) has been performed, the row decoder 6 determines the next pulse wave (second pulse wave P2 in this example) having a number of steps determined by the criterion voltage with which the writing verification is passed (Step S36).

FIGS. 35 and 36 show examples of the pulse waveform used in the writing operation. These waveforms of the writing voltage correspond to the waveforms of the erase voltage shown in FIGS. 21 and 22, and therefore, descriptions thereof will be omitted.

In this way, an optimum second pulse wave of the writing voltage can be applied to the control gate CG by changing the number of steps of the stepwise second pulse according to the result of the writing verification, and as shown in FIG. 34 described above, the number of writing loops can be reduced. In addition, according to this writing verification method, the writing operation can be achieved in a shorter time. For example, when the cumulative number of writings/erases operations is large, the threshold voltage of the memory cell M is brought close to the completely written state with a small number of applications of the writing pulse, so that the writing verification is passed with a low criterion voltage. Specifically, FIG. 36 shows a case where the cumulative number of writings/erases operations is small, and FIG. 35 shows a case where the cumulative number of writings/erases operations is large. Thus, when the cumulative number of writings/erases operations is large, the writing verification can be terminated earlier, and thus, the writing operation can be achieved in a shorter time.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a plurality of memory cells each having a control gate that are formed on a well; and
a control circuit that applies a voltage to the well and the control gates,
wherein in an erase operation of the memory cell,
the control circuit applies a first pulse wave of a first erase voltage that rises stepwise to the well and then applies a second pulse wave of a second erase voltage to the well,
the second erase voltage is a square wave, and
a step difference of the first erase voltage that rises stepwise is smaller than a difference between the second erase voltage of the second pulse wave and a final value of the first erase voltage that rises stepwise.

2. The semiconductor storage device according to claim 1, wherein a first pulse width of the first pulse wave is larger than a second pulse width of the second pulse wave.

3. The semiconductor storage device according to claim 1, wherein the second erase voltage is higher than a final value of the first erase voltage.

4. A semiconductor storage device, comprising:
a plurality of memory cells each having a control gate that are formed on a well and
a control circuit that applies a voltage to the well and the control gates,
wherein in an erase operation of the memory cell, the control circuit applies a first pulse wave of a first erase voltage that rises stepwise to the well and then applies a second pulse wave of a second erase voltage to the well, the second erase voltage rises stepwise, and a step difference of the second erase voltage that rises stepwise is smaller than a step difference of the first erase voltage that rises stepwise.

5. The semiconductor storage device according to claim 4, wherein a first value of the second erase voltage that rises stepwise is lower than a final value of the first erase voltage that rises stepwise.

6. The semiconductor storage device according to claim 4, wherein a final value of the second erase voltage that rises stepwise is higher than a final value of the first erase voltage that rises stepwise.

7. The semiconductor storage device according to claim 4, wherein, in the erase operation of the memory cell, the control circuit applies a third pulse wave of a third erase voltage to the well after applying the second pulse wave to the well.

8. The semiconductor storage device according to claim 7, wherein the third erase voltage is equal to or higher than a final value of the second erase voltage that rises stepwise, and the third erase voltage is a square wave.

9. A semiconductor storage device, comprising:

a plurality of memory cells each having a control gate that are formed on a well; and a control circuit that applies a voltage to the well and the control gates, wherein in an erase operation of the memory cell, the control circuit applies a first pulse wave of a first erase voltage that rises stepwise to the well and then applies a second pulse wave of a second erase voltage to the well, an erase verification of whether erase of the memory cell is completed or not is performed between the application of the first pulse wave to the well and the application of the second pulse wave to the well, and in a case where it is verified in the erase verification that erase of the memory cell is not completed, the control circuit changes the number of steps of the second pulse, which is a stepwise pulse, according to the level of the threshold voltage of the memory cell.

10. The semiconductor storage device according to claim 9, wherein a number of steps of the second erase voltage that rises stepwise is different from a number of steps of the first erase voltage that rises stepwise.

11. The semiconductor storage device according to claim 9, wherein a final value of the second erase voltage that rises stepwise is higher than a final value of the first erase voltage that rises stepwise.

* * * * *